United States Patent
Fukuda

(10) Patent No.: US 9,449,790 B2
(45) Date of Patent: Sep. 20, 2016

(54) PATTERN SHAPE EVALUATION METHOD, SEMICONDUCTOR DEVICE MANUFACTURING METHOD, AND PATTERN SHAPE EVALUATION DEVICE

(71) Applicant: Hitachi High-Technologies Corporation, Minato-ku, Tokyo (JP)

(72) Inventor: Hiroshi Fukuda, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/652,624

(22) PCT Filed: Dec. 25, 2013

(86) PCT No.: PCT/JP2013/084580
§ 371 (c)(1),
(2) Date: Oct. 19, 2015

(87) PCT Pub. No.: WO2014/104055
PCT Pub. Date: Jul. 3, 2014

(65) Prior Publication Data
US 2016/0035538 A1     Feb. 4, 2016

(30) Foreign Application Priority Data

Dec. 28, 2012  (JP) ................................ 2012-287906

(51) Int. Cl.
*H01J 37/26* (2006.01)
*H01J 37/28* (2006.01)
(Continued)

(52) U.S. Cl.
CPC ............ *H01J 37/285* (2013.01); *H01J 37/222* (2013.01); *H01J 37/265* (2013.01); *H01J 37/28* (2013.01);
(Continued)

(58) Field of Classification Search
USPC ...... 250/306, 307, 310, 492.1, 492.2, 492.3; 382/199, 203, 325
See application file for complete search history.

(56) References Cited

U.S. PATENT DOCUMENTS

| 7,719,097 B2 * | 5/2010 | Watanabe ......... H01L 27/14627 257/680 |
| 7,932,121 B2 * | 4/2011 | Watanabe ......... H01L 27/14627 438/113 |

(Continued)

FOREIGN PATENT DOCUMENTS

| JP | 2003-302214 A | 10/2003 |
| JP | 2004-251743 A | 9/2004 |

(Continued)

OTHER PUBLICATIONS

International Search Report (PCT/ISA/210) dated Feb. 25, 2014 with English translation (five pages).

(Continued)

*Primary Examiner* — Bernard Souw
(74) *Attorney, Agent, or Firm* — Crowell & Moring LLP

(57) ABSTRACT

A cross-sectional shape or a three-dimensional shape of a circuit pattern is estimated and evaluated only from a planar image of the circuit pattern observed from the above of a wafer. The present invention includes a process of obtaining an observation image of an upper surface of a solid structure, by causing the upper surface of a substrate to be irradiated and scanned with a converged energy beam from a direction substantially perpendicular to a main surface of the substrate having the structure formed on the upper surface thereof, and detecting and/or measuring intensities of a secondary energy beam generated in the substrate and the structure or an energy beam reflected or scattered from the substrate or the structure, a process of obtaining uncertainty information regarding an intensity of scattering caused by an irregular shape of a surface of the structure, from an irradiation position of the converged energy beam in the observation image of the upper surface and the measured intensity, a process of obtaining an inclination angle θ of the surface of the structure, based on the obtained uncertainty information; and a process of estimating a solid shape of the structure, based on the obtained inclination angle θ.

10 Claims, 21 Drawing Sheets

(51) Int. Cl.
*G01N 23/22* (2006.01)
*G01N 37/00* (2006.01)
*H01J 37/285* (2006.01)
*H01L 21/66* (2006.01)
*H01J 37/22* (2006.01)
*G01B 15/04* (2006.01)

(52) U.S. Cl.
CPC ............... H01L 22/12 (2013.01); *G01B 15/04* (2013.01); *G01B 2210/56* (2013.01); *H01J 2237/221* (2013.01); *H01J 2237/24578* (2013.01); *H01J 2237/24592* (2013.01); *H01L 2924/0002* (2013.01)

(56) References Cited

U.S. PATENT DOCUMENTS

| | | | |
|---|---|---|---|
| 8,258,472 B2* | 9/2012 | Shindo | G01B 15/04 250/306 |
| 8,309,923 B2* | 11/2012 | Omori | G01B 15/04 250/305 |
| 8,767,038 B2* | 7/2014 | Miyamoto | G01B 15/04 250/307 |
| 2004/0195507 A1 | 10/2004 | Yamaguchi et al. | |
| 2006/0145076 A1 | 7/2006 | Yamaguchi et al. | |
| 2007/0198955 A1 | 8/2007 | Nagatomo et al. | |
| 2009/0263024 A1 | 10/2009 | Yamaguchi et al. | |

FOREIGN PATENT DOCUMENTS

| | | |
|---|---|---|
| JP | 2005-183369 A | 7/2005 |
| JP | 2006-215020 A | 8/2006 |
| JP | 2007-227618 A | 9/2007 |
| JP | 2009-257937 A | 11/2009 |
| JP | 2012-21832 A | 2/2012 |
| JP | 2012-173028 A | 9/2012 |

OTHER PUBLICATIONS

Japanese-language Written Opinion (PCT/ISA/237) dated Feb. 25, 2014 (four pages).

Ikegami et al. "Evolution and Future of Critical Dimension Measurement System for Semiconductor Processes" Hitachi Review, 2011, pp. 203-209, vol. 60, No. 5.

Huang et al. "Scatterometry measurement for gate ADI and AEI CD of 28nm metal gates" Solid State Technology, Aug./Sep. 2011, pp. 11-13, vol. 54, No. 8.

Villarrubia et al. "Dimensional Metrology of Resist Lines using a SEM Model-Based Library Approach," Metrology, Inspection, and Process Control for Microlithography XVIII, Proceedings of SPIE vol. 5375, 2004, pp. 199-209.

* cited by examiner $\Delta x = (L/2) \cos \theta$ $\Delta x = H \sin \theta$

Fig. 10A1
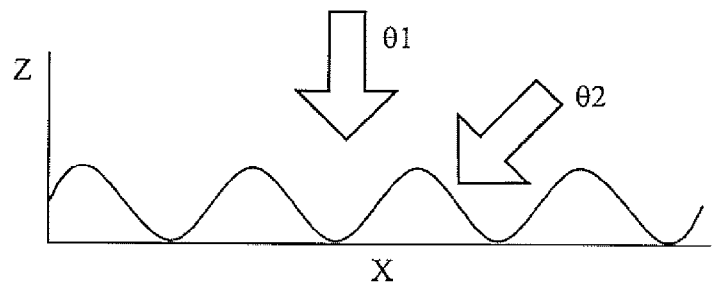
Fig. 10A2
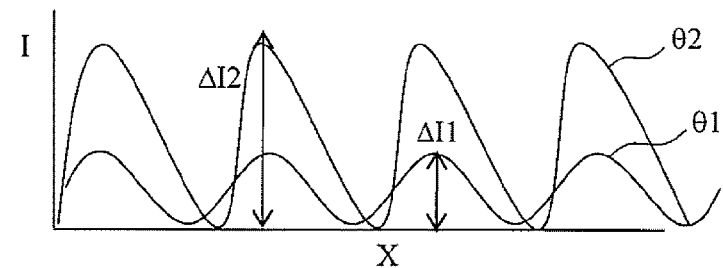
Fig. 10B
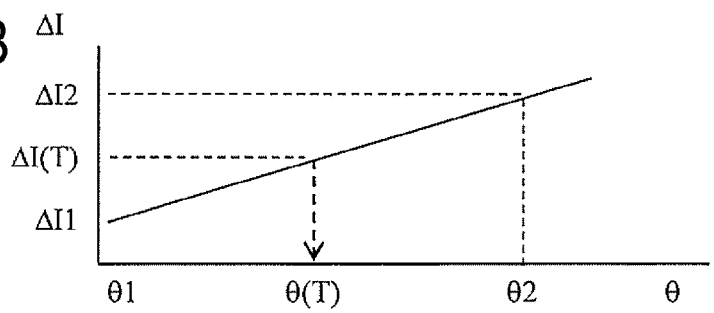
Fig. 10C
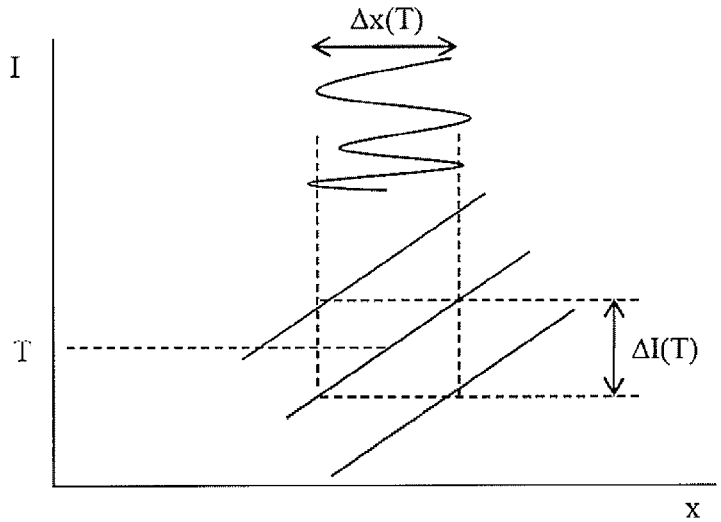

PATTERN SHAPE EVALUATION METHOD, SEMICONDUCTOR DEVICE MANUFACTURING METHOD, AND PATTERN SHAPE EVALUATION DEVICE

TECHNICAL FIELD

The present invention relates to a detailed shape evaluation method through nondestructive observation and image processing using for example, a scanning microscope, an apparatus therefor, and a semiconductor device manufacturing method employing the art.

BACKGROUND ART

With respect to a semiconductor integrated circuit (LSI), higher performance and higher integration due to miniaturization of circuit patterns have progressed. Currently, the line width of a smallest circuit pattern of an advanced LSI is 30 nanometers (nm) or less, and it is necessary to exactly manage a circuit dimension (for example, with the accuracy of the tolerance of a variation in a dimension being 10% or less of a designed value) in order to ensure the performance of the LSI. A scanning electron microscope (SEM) is now widely used to measure the circuit dimension. NPL 1 discloses an electric field emission-type electron microscope (CD-SEM: Critical Dimension SEM) dedicated to circuit dimension measurement for observing a wafer from an upper surface thereof.

The CD-SEM is used for measuring various features as well as the line width measurement of a semiconductor circuit. For example, it has been known that roughness called line edge roughness (LER) is present in the edge of the circuit pattern, which adversely affects the circuit performance. The CD-SEM is widely used for the measurement of the LER, and for example, PTL 1 discloses a measurement method thereof.

Meanwhile, there is a demand for a solid shape of an element structure formed on a wafer through lamination and patterning processes. In particular, it is desirable to perform observation in a non-destructive manner without depending on the cross-section observation in an LSI mass production process, and an AFM or an optical method (scatterometry) is generally used as a method therefor.

The AFM is a method for measuring the shape of roughness on a sample surface by scanning the sample surface by using a probe with a fine tip in such a manner that atomic force between the tip of the probe and the sample surface is constant. The details thereof are described, for example, in PTL 2.

The scatterometry estimates the cross-sectional shape of a solid structure, by measuring the wavelength of the reflected and diffracted light or diffraction angle dependency by applying light to a pattern having a periodic solid structure, and comparing the measured dependency with a diffraction angle dependency that is obtained in advance through calculation for various cross-sectional shapes. The scatterometry is described in, for example, NPL 2.

There is a model-based library (MBL) method as a method similar to scatterometry, which estimates a cross-sectional shape using the SEM. The MBL method estimates a cross-sectional shape of a solid structure by comparing a secondary electron intensity distribution of the detection signal obtained by scanning a sample with converged electron beams, with a secondary electron signal intensity distribution that is obtained in advance through calculation for various cross-sectional shapes. The MBL is described in, for example, PTL 3 or NPL 3.

In addition, a tilt-SEM can be used as a method for measuring a solid structure using a SEM. This method estimates a three-dimensional shape according to a principle of a stereoscopic image, from a plurality of images obtained by applying electron beams to the wafer from different angles. The tilt-SEM is described in, for example, PTL 4.

CITATION LIST

Patent Literature

PTL 1: JP-A-2006-215020
PTL 2: JP-A-2009-257937
PTL 3: JP-A-2007-227618
PTL 4: JP-A-2005-183369

Non Patent Literature

NPL 1: Hitachi Review vol. 60 (2011), No. 5 pp. 203-209
NPL 2: Solid State Technology, Vol. 54, Issue 8, (2011)
NPL 3: Proceedings of SPIE Vol. 5375 (SPIE, Bellingham, Wash., 2004) Dimensional Metrology of Resist Lines using a SEM Model-Based Library Approach

SUMMARY OF INVENTION

Technical Problem

In a manufacturing process of a semiconductor integrated circuit (LSI), it is important to manage a cross-sectional shape of a circuit pattern, a resist pattern for forming the circuit pattern, or the like, or a three-dimensional shape to be within a predetermined design range. It is necessary to suppress quality degradation by setting production conditions in such a manner that the shape is formed with designed values, or by quickly detecting a deterioration in the shape and feeding back the information regarding the deterioration to the manufacturing process.

However, until now, there is technical problem in that there is not a method capable of measuring a cross-sectional shape or a three-dimensional shape of a fine circuit pattern of an arbitrary shape, in a non-destructive manner, accurately, and conveniently. For example, the CD-SEM is capable of measuring the dimension of a fine circuit pattern of an arbitrary shape in a non-destructive manner, accurately, and conveniently, but has a technical problem in that it is difficult to estimate the cross-sectional shape because the planar shape of the circuit is observed from the above of a wafer.

Thus, in general, a method is used which exposes a cross-section of a circuit pattern by destroying a wafer and observes the cross-sectional shape by an electron microscope. However, it is difficult to apply the method to a wafer product. Thus, in the related art, the estimation of a cross-sectional shape using the CD-SEM is considered to be difficult, and various methods have been attempted as described above.

However, even in any of these methods, there are technical problems as follows.

For example, in the method according to the AFM, there is a problem in that with a reduction in the dimension of a circuit pattern, the probe cannot penetrate between patterns and the shape measurement becomes difficult.

Further, in the method according to the scatterometry or the MBL, it is necessary to calculate and obtain in advance measurement results to be expected for various cross-sectional shapes, and prepare the measurement results as a library. However, there is a problem in that this requires enormous amounts of calculation, and applicable shapes are limited to relatively simple shapes such as a trapezoid. In particular, in the method according to the scatterometry, since patterns to be measured are limited to periodic patterns present uniformly in a wide region of a few tens of microns square, it is difficult to estimate a cross-sectional shape of an irregular pattern such as a circuit of a logic LSI. The method also has a problem in that it is necessary to secure a wide area dedicated for the measurement pattern.

Further, in the method according to the tilt-SEM, there is a problem in that a special electron-optical system for varying an incidence angle of a converged electron beam is required, and in general, the performance of resolution or the like deteriorates. Further, there are also problems in that a device becomes large for tilting a stage and it requires time for measurement.

Thus, the present invention provides a technology capable of estimating a cross-sectional shape of an arbitrary structure that is formed on an upper surface of a substrate, in a non-destructive manner and accurately, while using only an observation image of an upper surface of a substrate, which is obtained using a charged particle beam apparatus.

Solution to Problem

In order to solve the problems described above, for example, configurations claimed in claims are adopted. According to an example of the invention, there is provided a pattern shape evaluation method causing a computer to perform: (a) a process of obtaining an observation image of an upper surface of a solid structure, by causing the upper surface of a substrate to be irradiated and scanned with a converged energy beam from a direction substantially perpendicular to a main surface of the substrate having the three-dimensional structure formed on the upper surface thereof, and detecting and/or measuring intensities of a secondary energy beam generated in the substrate and the structure or an energy beam reflected or scattered from the substrate or the structure; (b) a process of obtaining uncertainty information regarding an intensity of scattering caused by an irregular shape of a surface of the structure, from an irradiation position of the converged energy beam in the observation image of the upper surface and the measured intensity; (c) a process of obtaining an inclination angle θ of the surface of the structure, based on the obtained uncertainty information; and (d) a process of estimating a solid shape of the structure, based on the obtained inclination angle θ.

Advantageous Effects of Invention

According to the present invention, it is possible to estimate and evaluate a cross-sectional shape or a three-dimensional shape of a structure that is formed on an upper surface of a substrate, only from an observation image of the upper surface of the substrate. Problems, configuration, and effects in addition to those described above will be apparent from the following description of embodiments.

BRIEF DESCRIPTION OF DRAWINGS

FIGS. 10A1, 10A2, 10B, and 10C are principle diagrams explaining another model for obtaining the relationship between the inclination angle of the structure surface and the edge detection point variation width.

DESCRIPTION OF EMBODIMENTS

Hereinafter, embodiments of the present invention will be described with reference to the drawings. In addition, the embodiments of the present invention are not intended to be limited to the examples of embodiments described below, and various modifications are possible within the scope of the technical spirit of the invention. For example, the following description will be made regarding a case of observing a sample using an electron microscope, but the description can be similarly applied to the case of observing or processing the sample using a focused ion beam apparatus or other charged particle beam apparatus.

(Edge Variation Factor and its Component Decomposition of Three-Dimensional Shape Observation Image)

First, a formation process of an observation image by an electron microscope used in the present invention will be described with reference to FIG. 1. For the sake of simplicity, an approximately cubic-shaped structure (for example, a semiconductor, a resist pattern, or the like) formed on a substrate surface is considered. The substrate surface is an x-y plane, and a direction of extension of the edge of a structure (edge direction) is a y-direction. The substrate is irradiated with an electron beam that is converged in a sufficiently thinner manner than the characteristic dimension of the structure, from a direction (z-direction) substantially perpendicular to the substrate surface, and the substrate is scanned in a direction (x-direction) substantially perpendicular to the edge direction. Electrons incident on the substrate or the structure are scattered in the inside of the substrate or the structure, and secondary electrons are discharged; otherwise the electrons are directly reflected (or back scattered) and some thereof are discharged to the outside of the substrate or the structure. The discharge amount of the secondary electrons or the reflected electrons (hereinafter, referred to as "secondary electrons or the like") is increased when the electron beam is incident on a convex portion of a convex shape (or the upper part of a corner).

Figure 1:
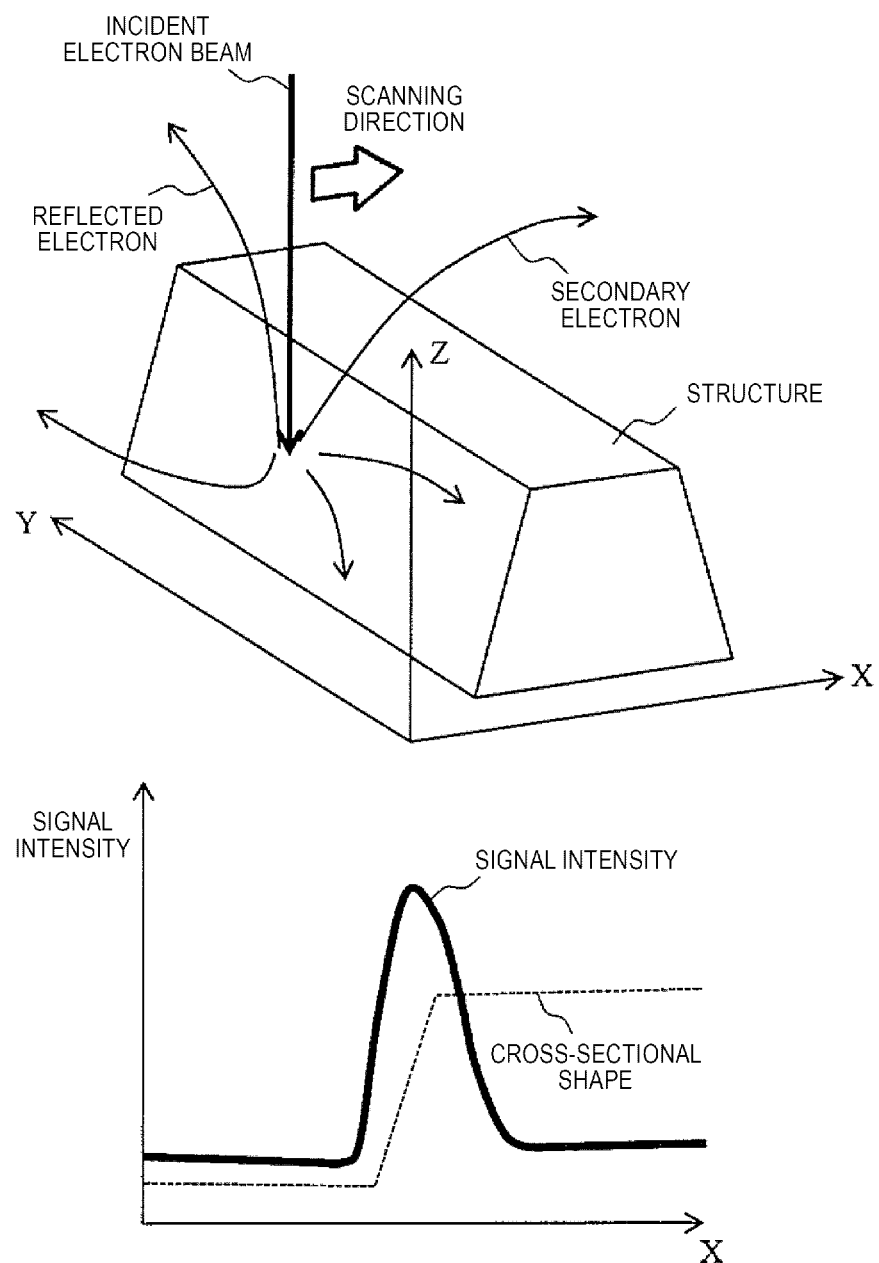
FIG. 1 is a conceptual diagram illustrating an observation image formation process of an electron microscope.

Thus, if the secondary electrons and the like that are discharged during the scanning of the electron beams are detected by a detector, and the detected intensity is plotted relative to an irradiation position x of an electron beam in a scanning direction, the intensity distribution of the detection signal of the secondary electrons or the like is obtained as illustrated in the lower part of FIG. 1. In general, a boundary between a pattern and a non-pattern is determined based on a position where the intensity distribution of the detection signal is taken at a predetermined threshold level after the intensity distribution of the detection signal is normalized with the maximum value of the detection signal, a position where the inclination of the intensity distribution of the detection signal is maximum, or the like. A pattern dimension is measured from a distance between two pattern boundary positions. Further, the edge shape of a pattern is obtained by performing scanning at different positions in the edge direction (y-direction) and connecting the obtained pattern/non-pattern boundaries. Typically, the edge shape obtained in this manner exhibits an irregular shape along the edge direction. The size of such a roughness is referred to as line edge roughness. The present inventors have devised a method for estimating a solid shape of a pattern in a direction perpendicular to the substrate surface from the intensity distribution of the detection signal in a plane (hereinafter, referred to as "substrate surface") in a direction parallel to a pattern edge and a direction perpendicular thereto, by considering the cause of the roughness.

Figure 2A:
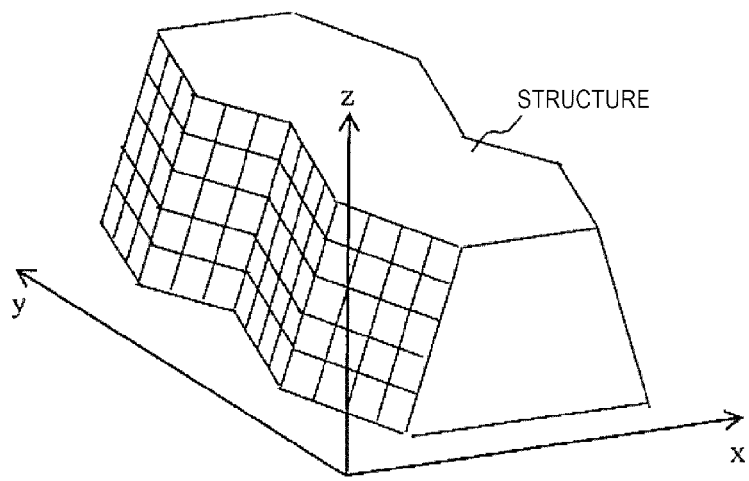
FIGS. 2A, 2B, and 2C are conceptual diagrams illustrating characteristics of an observed structure.
Figure 2B:
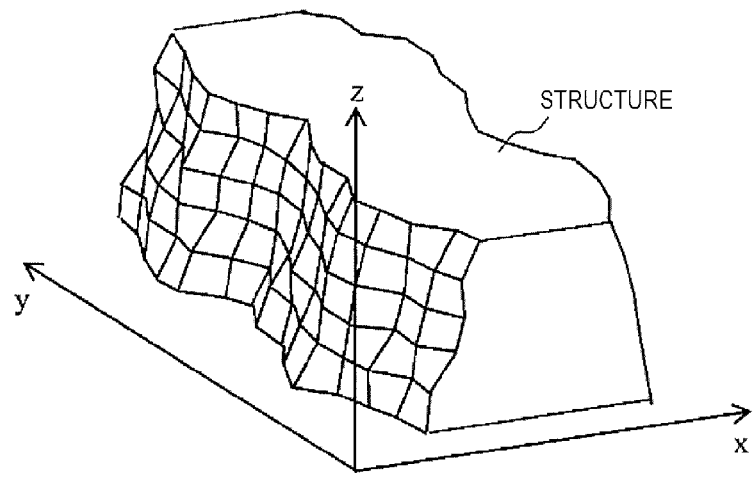
Figure 2C:
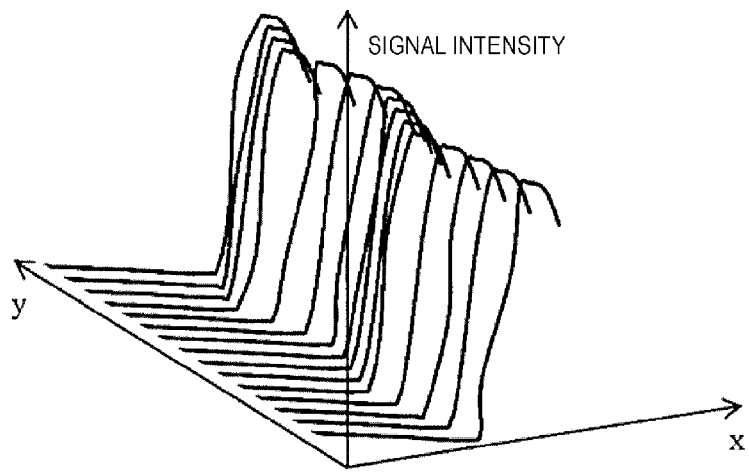

The above-described line edge roughness is generally considered to be due to the variation in the edge position of the structure illustrated in the upper diagram (a) of FIG. 2. An actual structure is not cubic, and its side wall is inclined as illustrated in the upper diagram (a) of FIG. 2, or has roughness on the surface (surface roughness) as illustrated in the middle diagram (b) of FIG. 2. The intensity distribution of the detection signal is considered to be affected by the variation in the inclination angle or the roughness of the surface.

If the secondary electron detection signal intensity is measured by scanning electron beams in the x direction from the start points which are defined at a constant sampling interval in the y-direction, a two-dimensional distribution of the secondary electron detection signal intensity is obtained as illustrated in the lower diagram (c) of FIG. 2. Here, the two-dimensional distribution of the secondary electron detection signal intensity is considered to be affected by three factors: (1) an intensity change due to the solid shape and the material properties of the structure, (2) a variation in the intensity distribution due to the variation in the position in the x-direction of the structure along the edge direction, and (3) a variation in the intensity distribution due to the roughness of the structure surface.

Figure 3A:
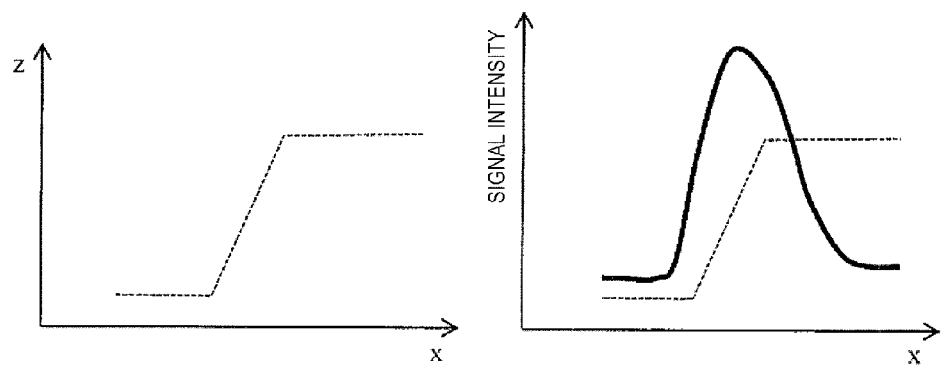
FIGS. 3A, 3B, and 3C are conceptual diagrams explaining the principle of the present invention.
Figure 3B:
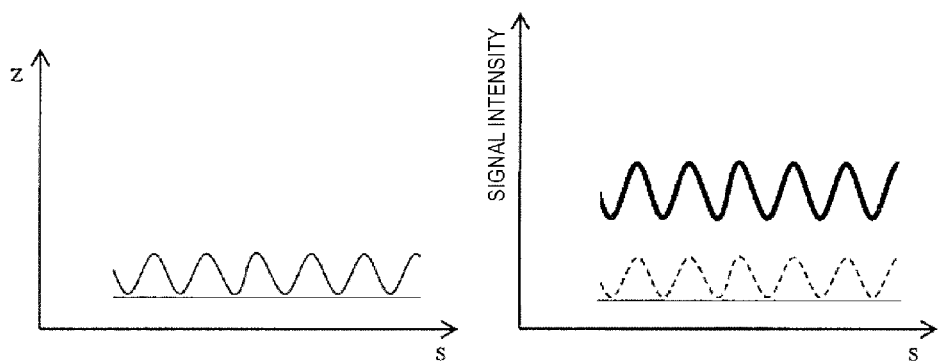
Figure 3C:
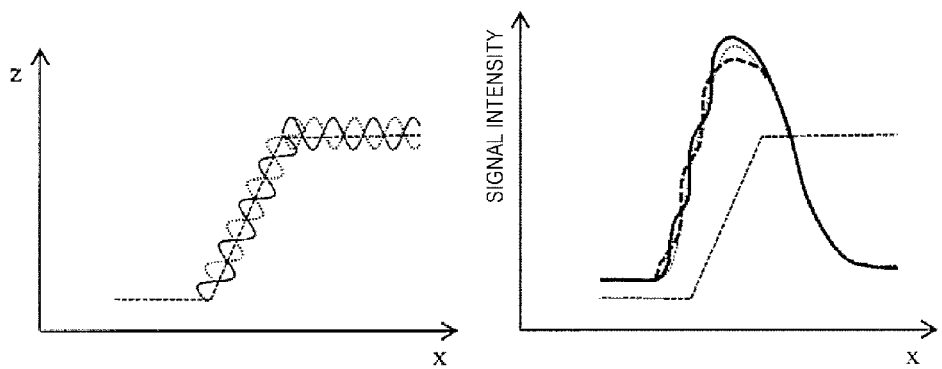

Therefore, the three factors are separately considered. First, the cross-sectional shape of a pattern taken along an x-z plane while fixing a y-coordinate, and a one-dimensional signal intensity distribution corresponding to the shape are considered. In this case, the structure in the middle diagram (b) of FIG. 2 is considered to have a shape in which a micro surface roughness structure which is schematically illustrated on the left side of the middle diagram (b) of FIG. 3 is superimposed on the surface of a macro pattern structure which is schematically illustrated on the left side of the upper diagram (a) of FIG. 3. An image in which the macro pattern and micro pattern are overlapped with each other is illustrated on the left side of the lower diagram (c) of FIG. 3.

As described above, if electron beams are incident on the convex portion, the discharge amount of the secondary electrons increases; and conversely, if electron beams are incident on the concave portion, the discharge amount decreases. Therefore, if the macro structure of the entire pattern is observed, since the upper surface corner of the pattern is a convex shape, the signal intensity increases toward the upper surface corner (the right side of the upper diagram (a) of FIG. 3). Meanwhile, if the micro structure is observed, when electron beams are incident on the convex portion of the roughness present on the pattern surface, the signal intensity increases (the right side of the middle diagram (b) of FIG. 3). Therefore, the secondary electrons signal intensity distribution in response thereto has a distribution (the right side of the lower diagram (c) of FIG. 3) in which a fine signal variation (the right side of the middle diagram (b) of FIG. 3) corresponding to the rough surface structure is superimposed on a large peak-like distribution corresponding to the macro pattern structure (the right side of the upper diagram (a) of FIG. 3). However, since the incidence angle of the electron beam for the roughness changes in the side of the structure, it is noted that a signal change due to roughness also changes.

Here, the distribution of the secondary electron signal intensity for the x-direction at a certain position in the y-direction is considered. Since it is considered that the surface roughness is generated at random, the corresponding signal intensity distribution also varies with uncertainty from a solid line to a dashed line on the right side of the lower diagram (c) of FIG. 3. In the measuring SEM, the x-coordinate where the obtained intensity distribution of the secondary electron signal is taken at a certain threshold is detected as an edge coordinate.

However, if changing the threshold, a plurality of edges corresponding to different height positions z of the structure is detected. The edge coordinate varies with uncertainty, and the characteristics of the variation amount $\sigma$ are a function of the threshold. In other words, it is a function of different height positions z of the structure (or positions x in a direction vertical to the edge).

In a first embodiment to be described below, a method of estimating a solid (cross-sectional) shape z(x) of the structure from the characteristics of the function will be described. Further, in a second embodiment, a method of estimating a two-dimensional solid shape by using a two-dimensional signal intensity distribution will be described. In addition, the details of the second embodiment will be described in Example 4 to be described later.

First Embodiment

Figure 4A:
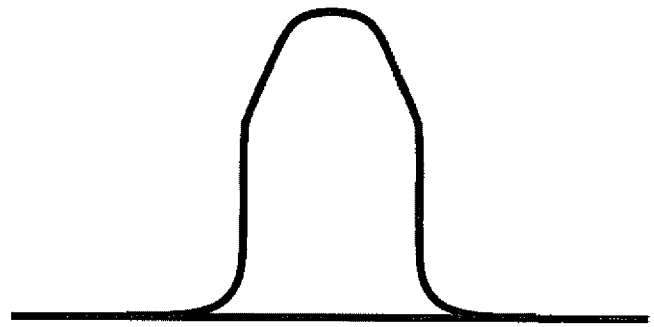
FIGS. 4A, 4B, and 4C are a schematic diagrams illustrating characteristics of a cross-sectional shape of a sample for explaining a first embodiment.
Figure 4B:
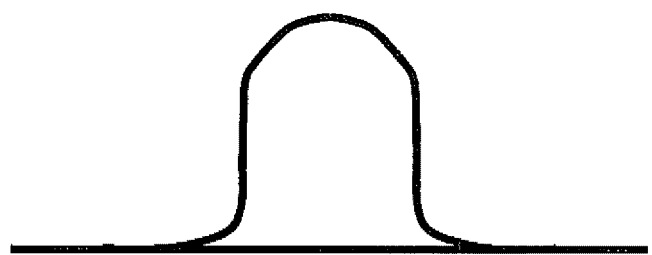
Figure 4C:
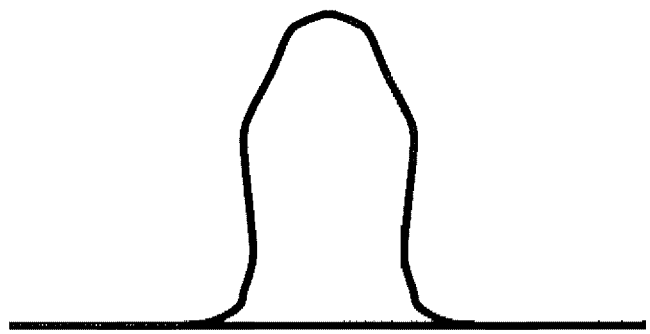

The following description will be made regarding details of a solid (cross-section) shape estimation method of a structure according to the first embodiment of the present invention. In the following description, three types of samples A, B, and C having cross-sectional profiles respectively illustrated in an upper diagram (a), a middle diagram (b), and a lower diagram (c) of FIG. 4 are to be analyzed.

First, the observation image of the upper surface of the structure having the three types of cross-sectional profiles is obtained by CD-SEM, and the edge portion of the structure is specified in an analysis region. The linear portion on the design is selected as the target edge, and a direction along the straight line is the y-direction.

Figure 5A:
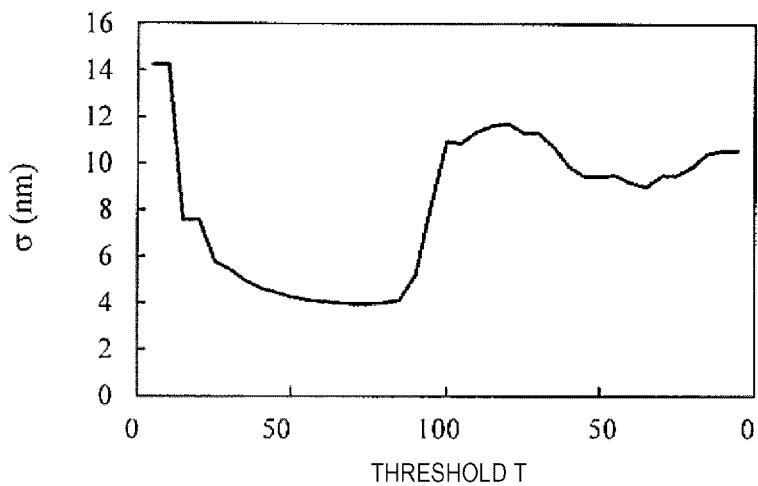
FIGS. 5A, 5B, and 5C are characteristic diagrams schematically illustrating a measurement result for each sample illustrated in FIG. 4.
Figure 5B:
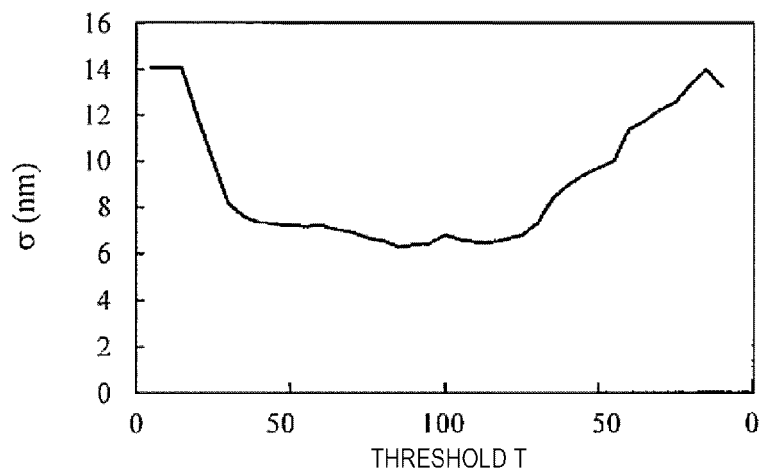
Figure 5C:
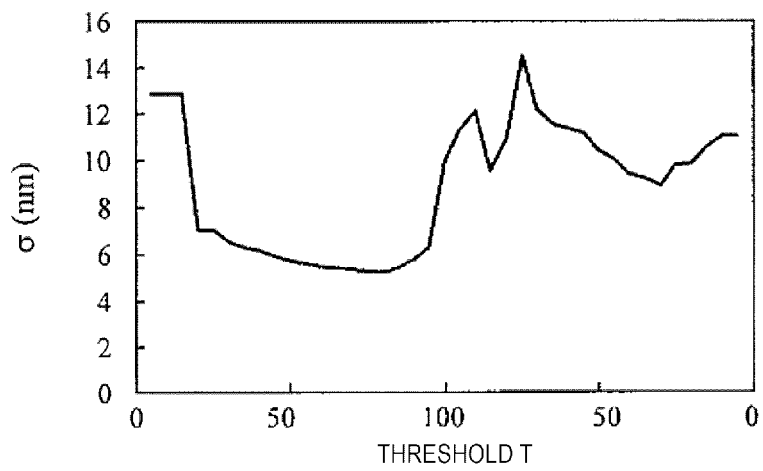

Next, the edge is detected by variously changing the threshold T during the edge detection, an edge point sequence, which is a function of T, $\{xi(T)\}$ (here, i=1, 2, ..., n) is obtained, and $\sigma^2(T) = \Sigma[xi(T) - \langle x(T) \rangle]^2$ from the average edge position $\langle x(T) \rangle$ of the point sequence is calculated. Next, if $\sigma(T)$ is plotted relative to the threshold T, an upper diagram (a), a middle diagram (b), and a lower diagram (c) of FIG. 5 are obtained. As described above, the point sequence illustrated in each stage corresponds to the structure having a cross-sectional profile of the same stage of FIG. 4.

In general, the x-direction distribution I(x) of the detection signal intensity has a peak in the vicinity of the edge of the structure. For example, if a so-called line pattern having a convex structure with a certain width W such as a resist line pattern is observed, two intensity peaks corresponding to both the right and left edges of each pattern illustrated in FIG. 4 appear. In other words, if one edge is observed, two edge detection points are obtained on both sides of the distribution peak of the detection signal intensity for the same threshold T. Thus, $\sigma(T)$ is obtained for both the inner side and the outer side of the structure of the peak.

In general, in the outer side (space side) of the structure, the intensity gradually increases from the outer side, and the x-coordinate of a point of which the intensity is a predetermined threshold is an edge position. Meanwhile, in the inner side (line side) of the structure, the intensity gradually increases from the inner side, and the x-coordinate of a point of which the intensity is a predetermined threshold is an edge position. $\sigma(T)$ is obtained from these values. In addition, if the width W of the pattern is extremely reduced, the peaks for the right and left edges are overlapped, and one peak is observed for one line pattern. In this case, the threshold and the x-coordinate correspond one-to-one.

Figure 6A:
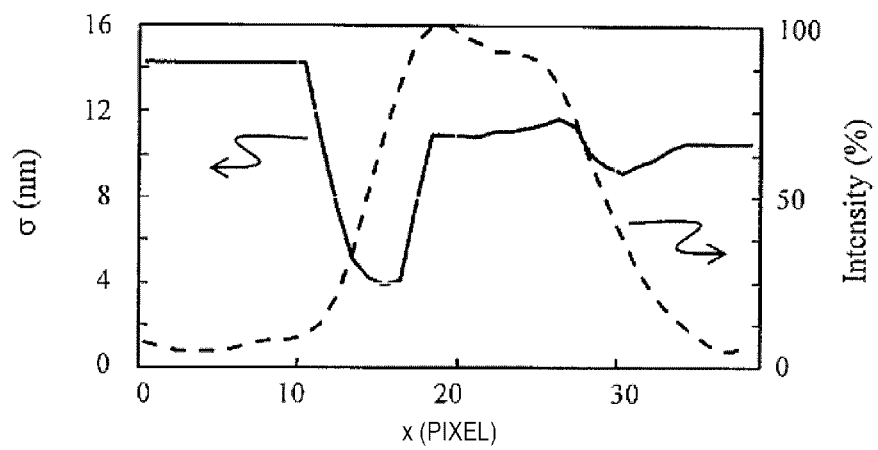
FIGS. 6A, 6B, and 6C are additional characteristic diagrams schematically illustrating a measurement result for each sample illustrated in FIG. 4.
Figure 6B:
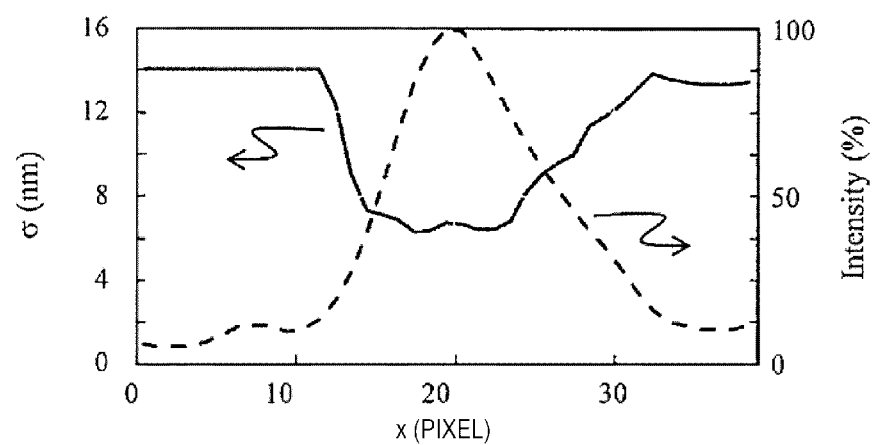
Figure 6C:
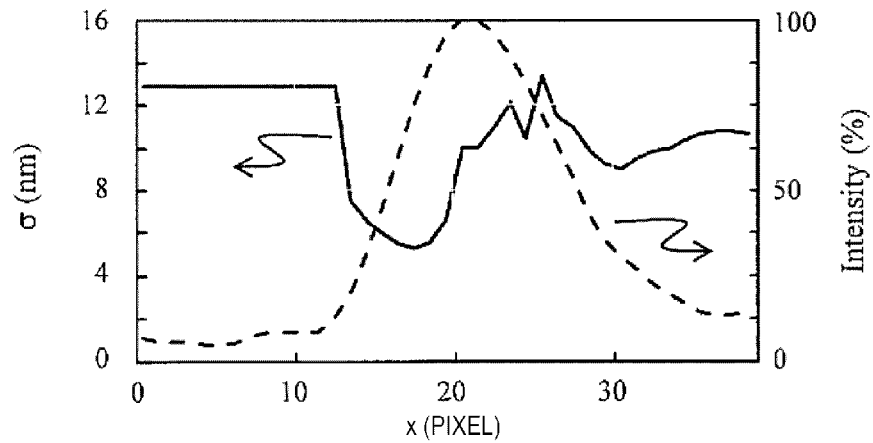

Next, in the analysis region, the average distribution $\langle I \rangle(x)$ in the y-direction of the distribution I(x) of the detection signal intensity is obtained, and each threshold T is associated with a particular x-coordinate at which the detection signal intensity is $\langle I \rangle(x) = T$. Thus, the deviation $\sigma(T)$ which is a function of the threshold T is converted to the deviation $\sigma(x)$ which is a function of x. In this case, the deviation $\sigma(T)$ for x of the outer/inner sides of the structure of the peak is associated with x of the outer/inner sides of each structure. If the deviation $\sigma(x)$ is plotted as well as the intensity distribution of the detection signal $\langle I \rangle(x)$, a characteristic diagram illustrated in FIG. 6 is obtained. The characteristic diagrams illustrated in an upper diagram (a), a middle diagram (b), and a lower diagram (c) of FIG. 6 correspond to the structure having the cross-sectional profile of the same stage of FIG. 4. Each of the diagrams of FIG. 6 represents the detected edge variations in the average edge position obtained for the electron beams incident on the position x.

In the case of a sample A which has a large reduction in a film thickness and a forward tapered shape (the upper diagram (a) of FIG. 4), the deviation $\sigma(x)$ is great in the flat surface of the outer lower part of the structure; if incident electron beams approach the edge, the deviation $\sigma(x)$ rapidly decreases to a minimum vale, thereafter, gradually increases towards the center of the structure, and becomes maximum near the flat surface of the upper part of the structure.

Meanwhile, in the case of the sample B which has a side wall of a substantially vertical or slightly reverse tapered shape, and a small reduction in a film thickness (the middle diagram (b) of FIG. 4) and the sample C (the lower diagram (c) of FIG. 4), the deviation $\sigma(x)$ has a minimum value, thereafter rapidly increases so as to have plateau-like peaks, decreases once, thereafter gradually increases towards the center of the structure, and becomes maximum in the vicinity of the flat surface of the upper part of the structure. The height of the peak is slightly greater in the sample C having a side wall with a reverse tapered shape.

The difference between the distribution shapes is considered to be affected by the difference of the cross-sectional profile.

Next, the meaning of the shape of the deviation $\sigma(x)$ will be described.

First, the average cross-sectional profile $\langle Z \rangle(x)$ is conveniently considered in association with the average intensity distribution of the detection signal $\langle I \rangle(x)$ in the inside of the analysis region, and the three-dimensional shape Z(x, y) of the actual structure is expressed by the following equation.

$$Z(x,y) = \langle Z \rangle(x + \Delta x(y)) + \Delta Z(x,y) \qquad \text{[Equation 1]}$$

In other words, it is considered that the three-dimensional shape Z(x, y) of the actual structure is obtained by shifting the average cross-sectional profile $\langle Z \rangle(x)$ by $\Delta x(y)$ in the x-direction according to the edge point position y, and giving variation $\Delta Z(x, y)$ to the cross-sectional profile. Here, $\Delta x(y)$ is determined for each y in such a manner that for example, the integration value in the x-direction of $|\Delta Z(x, y)|$ is minimum.

Next, corresponding to the representation, the three-dimensional distribution of the detected signal intensity that is actually observed can be expressed as follows.

$$I(x,y) = \langle I \rangle(x + \Delta x(y)) + \Delta I(x,y) + \Delta \text{noise}(x,y) \qquad \text{[Equation 2]}$$

Here, $\Delta I(x, y)$ is a term generated by the deviation from the average of the cross-sectional profile in response to $\Delta Z(x, y)$. $\Delta$noise (x, y) is a random detection noise superimposed on the actual detection image, and the amplitude does not depend on the position or the image. $\Delta x(y)$ is determined for each y in such a manner that for example, the integration value in the vicinity of the edges in the x-direction of $|\Delta I(x, y)|^2$ is minimum.

Further, corresponding to the representation, the deviation $\sigma(x)$ from the average of the edge point sequence to be detected can be divided into components attributable to the respective terms.

$$\sigma\_\text{measured}(x)^2 = \sigma\_y(x)^2 + \sigma\_xz(x)^2 + \sigma\_\text{noise}(x)^2 \qquad \text{[Equation 3]}$$

Here, σ_measured is the measurement result. σ_y is the component caused by the variation in the edge position of the structure when the cross-section is optimally fitted into the average cross-sectional profile, for each y. σ_xz is the component caused by the variation in the cross-sectional shape of the structure. σ_noise is the component caused by the edge detection error due to detection (image) noise.

(Details of a Decomposing Method of Edge Variation Component)

Next, a method of decomposing the measured edge variation value σ_measured into the above-described four components will be described. The following description will be given regarding each component.

Whereas in general, the spatial frequency characteristics in the variation in the y-direction of the edge position of the structure depend on the 1/f characteristics, the spatial frequency characteristics in the measurement variation and the detection noise due to the surface roughness are considered to be random. Thus, σ_y is considered to be a component having a 1/f characteristic with respect to the spatial frequency f in the y-direction (for convenience, referred to as "true LER").

In addition, a method of decomposing the variation of the edge point detection position in the x-direction which is measured along the edges into a component having a 1/f characteristic and the other components is described in PTL 1. Here, the decomposition of LER component may be performed for each threshold, or may be performed for a representative threshold T.

Figure 7:
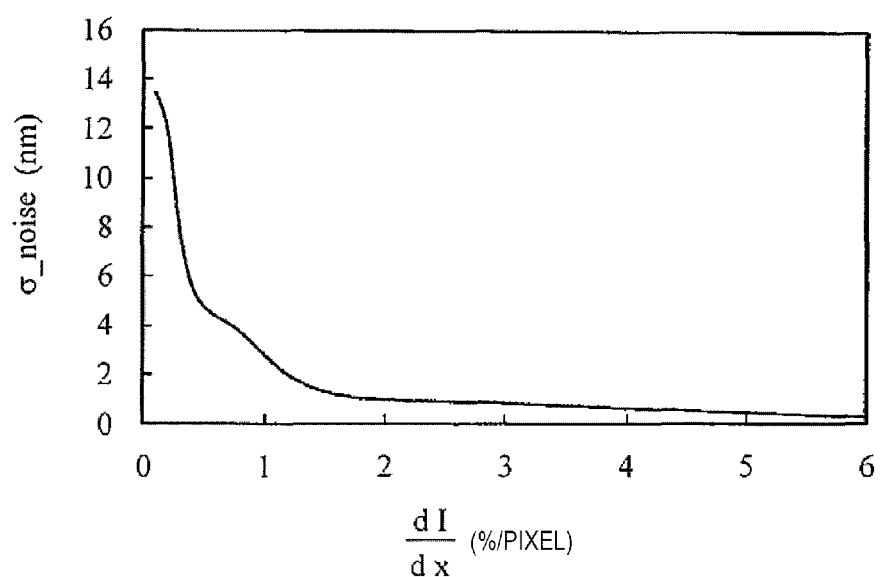
FIG. 7 is a characteristic diagram illustrating an impact of an image noise.

The true LER is a variation in the y-direction of the edge position itself of the structure. Therefore, the true LER can be considered as almost common for the measurement result obtained by changing the threshold T. Therefore, the latter consideration is reasonable.

σ_noise depends on the inclination of the signal intensity distribution. FIG. 7 illustrates a result of the variation in the edge points obtained relative to the threshold of the average level, by adding an intensity gradient to an image obtained for a smooth flat surface, in a one-dimensional x-direction. As illustrated in FIG. 7, if the intensity gradient of the detection signal increases, the σ_noise is reduced. The σ_noise(x) can be calculated by obtaining the σ_noise relative to the gradient at the position x of the average detected intensity distribution from FIG. 7.

It is possible to obtain σ_xz by excluding the contribution of σ_y and σ_noise from the measurement result σ_measured.

Figure 8A:
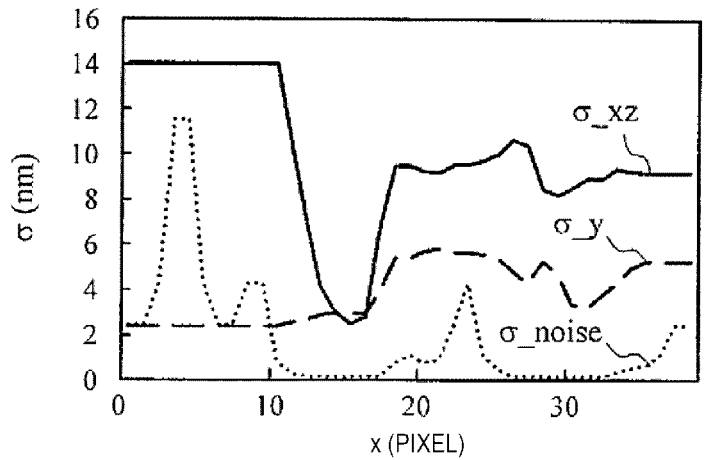
FIGS. 8A, 8B, and 8C are characteristic diagrams illustrating an analysis result for the measurement result illustrated in FIG. 6.
Figure 8B:
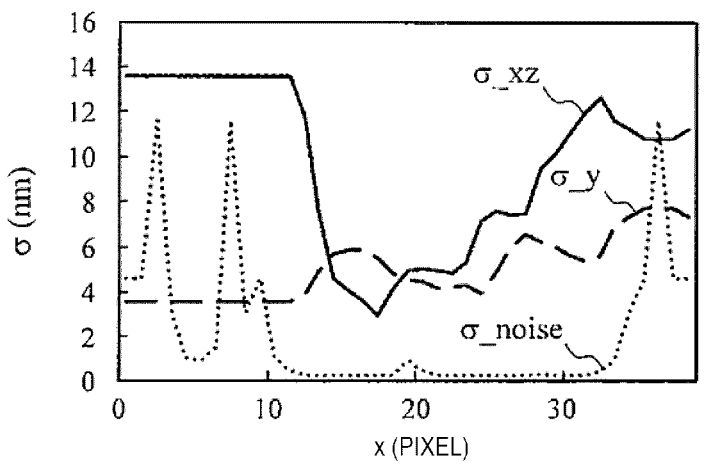
Figure 8C:
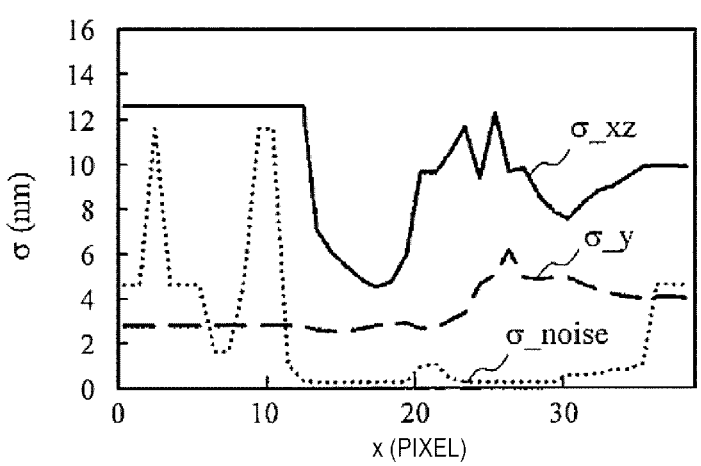

Here, the results obtained by calculating σ_y and σ_noise for the samples A, B, and C respectively having the cross-sectional profiles illustrated in the upper diagram (a), the middle diagram (b), and the lower diagram (c) of FIG. 4, and decomposing the measured result σ_measured into σ_y, σ_noise, and σ_xz are illustrated in an upper diagram (a), a middle diagram (b), and a lower diagram (c) of FIG. 8. As it can be seen from FIG. 8, when the cross-sectional profile is a reverse tapered shape, a significant peak appears in σ_xz.

Hereinafter, in order to consider the cause of the occurrence of a significant peak, the impacts of surface roughness on the intensity distribution of the detection signal are classified into the following two types.

[Classification 1]

In this classification, it is considered that electron beams are first incident on a forward tapered surface. In this case, the number of detected electrons which are scattered in the inside of the structure and discharged to the outside of the structure is considered to be affected by the irregular pattern in the immediate vicinity of the incidence position on the forward tapered surface.

[Classification 2]

In this classification, it is considered that electron beams are incident on a relatively flat surface in the upper portion of the structure away from the edge point. In this case, some of the electrons are detected which are scattered in the inside of the structure and discharged to the outside of the structure from the side surface or the reverse tapered surface of the structure. In this case, the electrons that are discharged to the outside are affected by the irregular pattern of the side surface. The absolute number of electrons that are discharged from the surfaces other than the incident surface to the outside is small. However, since the number of electrons that are detected by the surface scattering is also relatively small, the impact of the electrons which have been affected by the irregular pattern of the side surface on the detection result for the forward tapered surface is not considered to be negligible.

The impact depends on the area of the vertical or reverse tapered surface within a range of an electron beam penetration length in the structure. The higher the height of the vertical or reverse tapered surface is, the greater the impact is. Further, the impact is made on the electron beams incident on a relatively wide region of the inward from the edge of the structure.

In a structure having a vertical or reverse tapered side surface, the peak of σ_xz illustrated in each of the upper diagram (a), the middle diagram (b), and the lower diagram (c) of FIG. 8 occurs when electron beams are incident on the upper flat surface of the structure. From this fact, the peak of σ_xz occurring on the upper flat surface of the structure is considered to be due to the classification 2.

Thus, σ_xz is represented by (Equation 4) in which σ_xz is decomposed into two following components (1) An impact of an irregular pattern on the forward tapered surface in the vicinity of the electron beam incidence point
: σ_xz_near (2) An impact of an irregular pattern on the substantially vertical or reverse tapered surface relatively far from the electron beam incidence point
: σ_xz_far $$\sigma\_xz^2 = \sigma\_xz\_near'^2 + \sigma\_xz\_far^2 \qquad \text{[Equation 4]}$$

The details of the above components (1) and (2) will be described later.

First, the impact of roughness on the scattering of electron beams incident on the forward tapered surface having an irregular pattern (the above component (1)) is considered. It is assumed that a sinusoidal roughness is present on the inclined surface of a certain angle, and beams are incident on the center of the concave portion or the convex portion (a point P in the upper diagram (a) of FIG. 9). If the phase of the roughness is changed by 180 degrees relative to the incidence position of the beams, a detection position is varied by one period in the ± direction of the phase. For example, when the beam is incident on the center of the concave portion, the detection position maximally deviates in the + direction of the phase; and when the beam is incident on the center of the convex portion, the detection position maximally deviates in the − direction of the phase.

In the following description, for the sake of simplicity of explanation, as illustrated in the upper diagram (a) of FIG. 9, an average inclination angle θ is constant, and a point P on the average side wall surface of the structure of a sidewall shape having an irregular pattern along the surface is considered. If a convex portion center of the surface roughness of a representative period L is present on the point P, when electrons are incident toward the point P, the increase of the detected signal intensity is maximum and the shift amount of the edge detection position is maximum in the − direction. Conversely, if a concave portion center of the surface roughness is present on the point P, the decrease of the detected signal intensity is maximum and the shift amount of the edge detection position is maximum in the + direction.

In this case, the shift amount of the detection position of the edge due to the roughness is determined by the x-coordinate position of the convex portion center, and the variation amplitude $\Delta x$ is a distance between the convex portion centers in the x-direction of the two cases. Therefore, if the period of the roughness on the side wall surface is L (in other words, the distance in the x-direction is L/2) and the detection position is determined in the middle diagram (b) of FIG. 9, the variation width $\Delta X$ of the detection position of the edge can be estimated from the period L of the roughness and the angle (inclination angle) $\theta$ of the side wall inclined surface, as the following equation.

$$\Delta X = L/2 \cdot \cos\theta \quad \text{[Equation 5]}$$

Figure 9A:
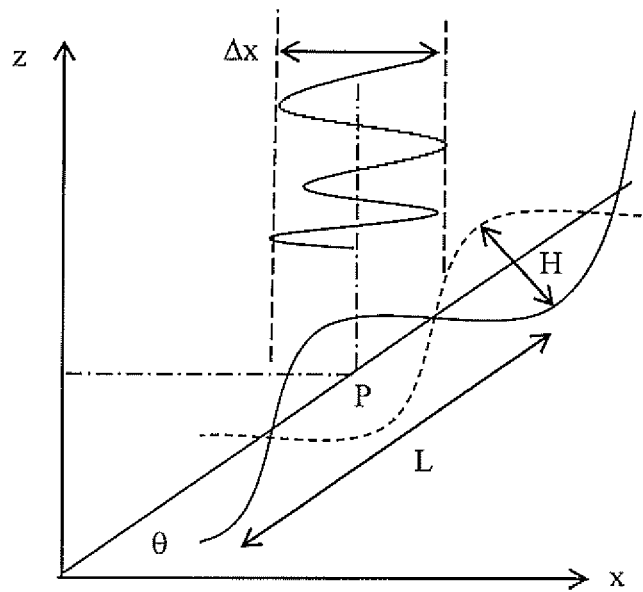
FIGS. 9A, 9B, and 9C are principle diagrams illustrating a relationship between an inclination angle of a structure surface and an edge detection point variation width.
Figure 9B:
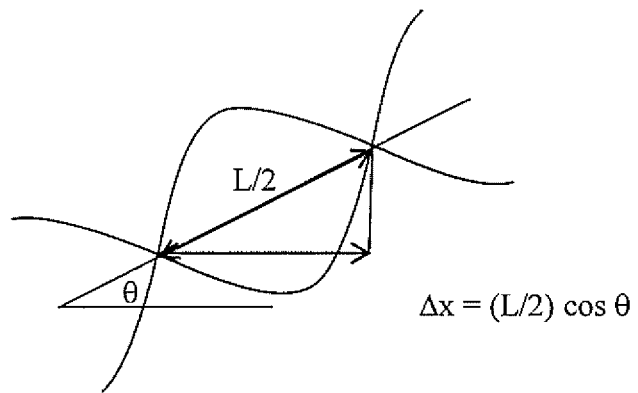
Figure 9C:
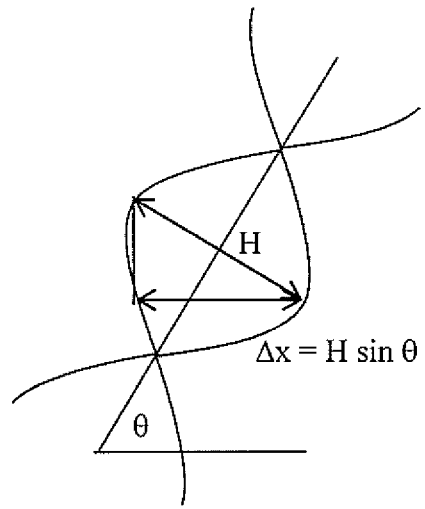

In contrast, if the detection position is determined in the lower diagram (c) of FIG. 9, the variation width $\Delta X$ of the detection position of the edge can be estimated from the height H and the angle (inclination angle) $\theta$ of the side wall inclined surface, as the following equation.

$$\Delta X = H \cdot \sin\theta \quad \text{[Equation 6]}$$

In general, Equation 5 becomes dominant in the region having a relatively small inclination angle $\theta$, and Equation 6 becomes dominant in the region having a relatively large inclination angle $\theta$. In practice, the inclination angle $\theta$ is considered to depend on both the period and the height of the roughness of the side surface. Therefore, the variation width $\Delta X$ of the detection position of the edge can be estimated from the following equation obtained by adding both Equations.

$$\Delta X = L/2 \cdot \cos\theta + H \cdot \sin\theta$$

or $$\Delta X^2 = (L/2 \cdot \cos\theta)^2 + (H \cdot \cos\theta)^2 \quad \text{[Equation 7]}$$

Further, the relationship between the variation width $\Delta X$ of the detection position of the edge and the inclined angle $\theta$ of the inclined surface can be obtained by using the property in which the amount of intensity variation in the electron beam signal due to surface roughness depends on the incidence angle of the electron beam relative to the surface.

For example, the intensity distribution of the detection signal when a plane having roughness of a suitable period L or a height H thereon is irradiated and scanned with electron beams at various incidence angles (the upper diagram (a1) of FIG. 10) is calculated through simulation (the upper diagram (a2) of FIG. 10). In this case, the variation width $\Delta I$ of the detected intensity is a function of the inclined angle $\theta$ (the middle diagram (b) of FIG. 10).

Meanwhile, the relationship between the intensity variation width $\Delta I(\theta)$, the variation width $\Delta X$ of the edge detection position, and the average signal intensity distribution $I(x)$ can be expressed by the following equation as illustrated in the lower diagram (c) of FIG. 10.

$$\Delta X = \Delta I(\theta)/(dI(x)/dx) \quad \text{[Equation 8]}$$

However, in Equation 8, if the gradient at the peak of the intensity distribution of the detection signal is 0 (zero), the value diverges. Therefore, it should be noted that Equation 8 cannot be used when the gradient at the peak of the intensity distribution of the detection signal is 0 (zero). In practice, the amplitude $\Delta X$ of the edge shift amount is a statistic amount that is estimated from the measured variation of the edge detection position, and corresponds to $\sigma\_xz\_near$. Further, since the irregular pattern of the sidewall surface is random amount, statistical representative values are used for the period L and the height H. For example, for the sake of convenience, the period L and the height H maybe selected such that the inclination angle $\theta$ of the flat surface is 0 (zero).

Next, the above component (2) (the impact of the irregular pattern on the surface position away from the incidence position of the beam) will be described.

Figure 11A:
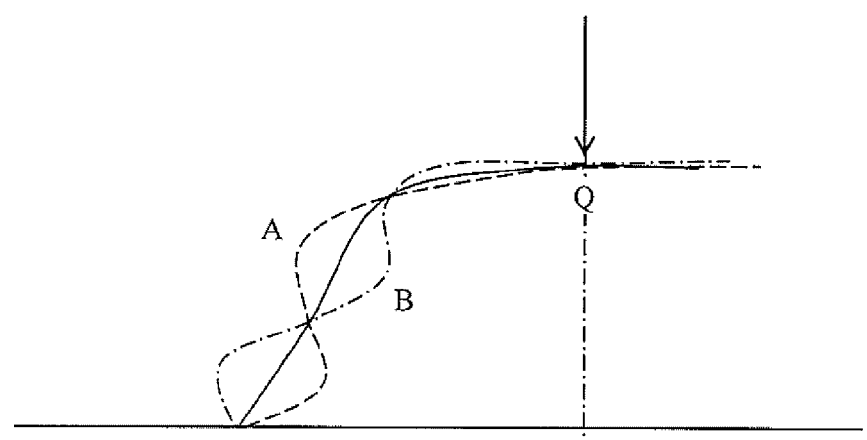
FIGS. 11A and 11B are schematic diagrams illustrating an impact of a variation in a structure side on a detection signal intensity for an electron beam that is incident on a point relatively distant from the side.
Figure 11B:
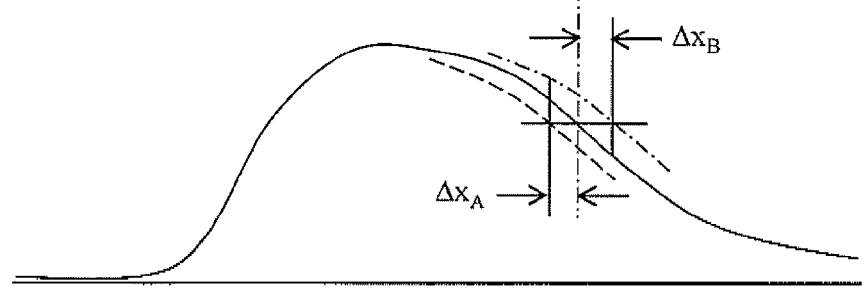

The case is considered in which if the detected intensity for the average sidewall surface is IQ when electron beams are incident on the Q point in the upper diagram (a) of FIG. 11, the pattern of the sidewall surface varies as illustrated by curves A and B in FIG. 11. In this case, as illustrated in the lower diagram (b) of FIG. 11, the detected intensity varies by $\Delta IA$ and $\Delta IB$ with respect to the detected intensity IQ, and the detection edges are respectively shifted by $\Delta x_A$ and $\Delta x_B$.

In this case, if the electron beams spread by the same amount as the size of the sidewall surface, the shift amount $\Delta x_A$ and $\Delta x_B$ appearing at the detection edge can be considered to be substantially constant, regardless of the incidence position (Q point).

Therefore, it is assumed that the influence of the aforementioned (2) is substantially constant while the incidence position of the electron beam is in the range where the scattered electrons in the structure from the edge position of the structure reach the side wall, and the distribution shape is approximated as a distribution shape of a trapezoid shape with respect to $\sigma\_xz\_far$.

Although the height of the trapezoid depends on the height and the angle of the side wall, for example, according to Equation 4, on the structure side from a minimum value of $\sigma\_xz$, the distribution of $\sigma\_xz\_near$ after subtracting $\sigma\_xz\_far$ from $\sigma\_xz$ is considered to be set to such a height approximately linearly increasing from 0 (zero). The results obtained by decomposing $\sigma\_xz$ into two components with respect to the respective samples corresponding to the upper diagram (a), the middle diagram (b), and the lower diagram (c) of FIG. 4 are illustrated in the upper diagram (a), the middle diagram (b), and the lower diagram (c) of FIG. 12.

(Estimation Method of Cross-Sectional Shape)

Next, a method for estimating the cross-sectional shape of a structure from the result of decomposing the deviation $\sigma$ representing the uncertainty will be described.

The cross-sectional shape of the actual structure is considered to have various shapes such as being rounded, or the skirt being pulled. That is, in general, the sidewall angle $\theta$ is not constant with respect to positions in the height direction or the x-direction of the structure. Even in such a structure, it is possible to properly estimate its cross-sectional shape by using the method according to the present embodiment.

A cross-section estimation method by two approaches of an analytical shape estimation method and a model-based shape estimation method will be described below.

(Analytical Estimation Method)

In the analytical estimation method, the local angle of the structure surface at the height corresponding to the structure is obtained using Equations 5, 6, 7, 8, and the like, with respect to a threshold or a position in the x-direction, and integrated in the x-direction, such that the cross-sectional shape of the structure is obtained. In other words, the cross-sectional shape is obtained by the following equation. However, the integration range in the following equation is 0 (zero) to x.

$$Z(x) = \int \tan(\theta(x'))dx' \qquad \text{[Equation 9]}$$

Figure 12A:
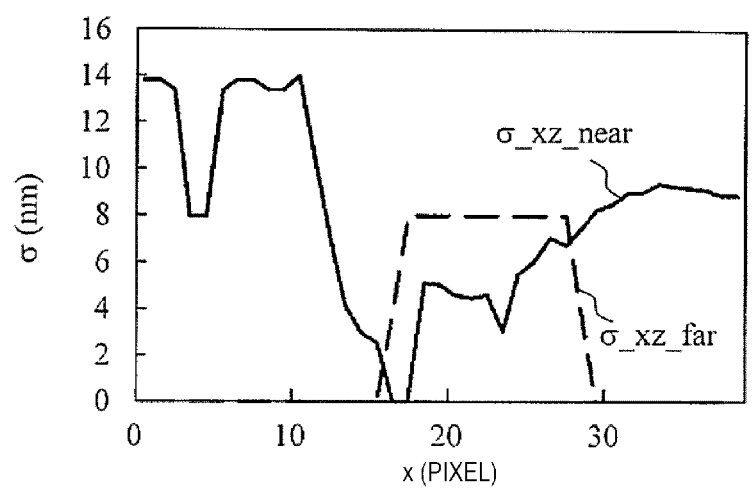
FIGS. 12A, 12B, and 12C are additional characteristic diagrams illustrating the analysis result for the measurement result illustrated in FIG. 6.
Figure 12B:
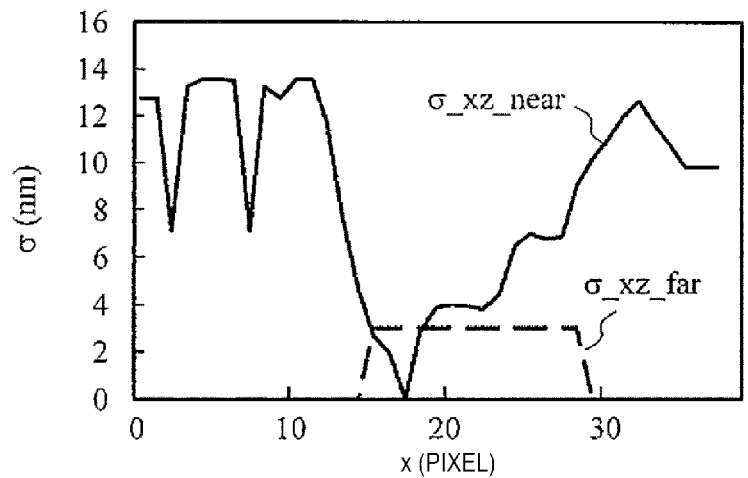
Figure 12C:
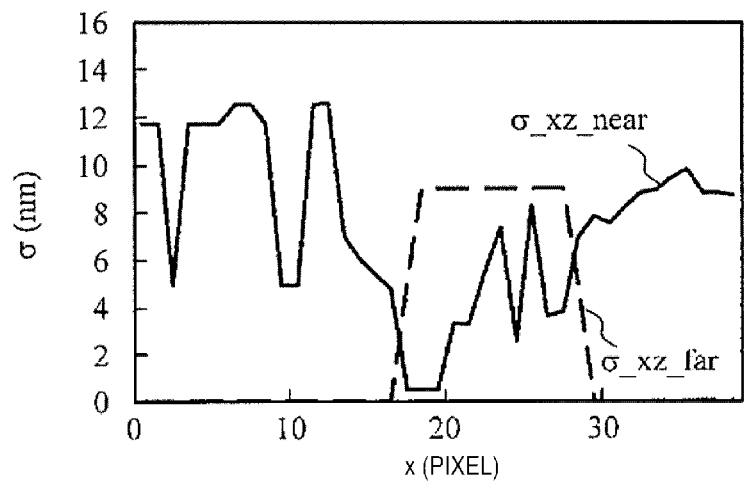
Figure 13A:
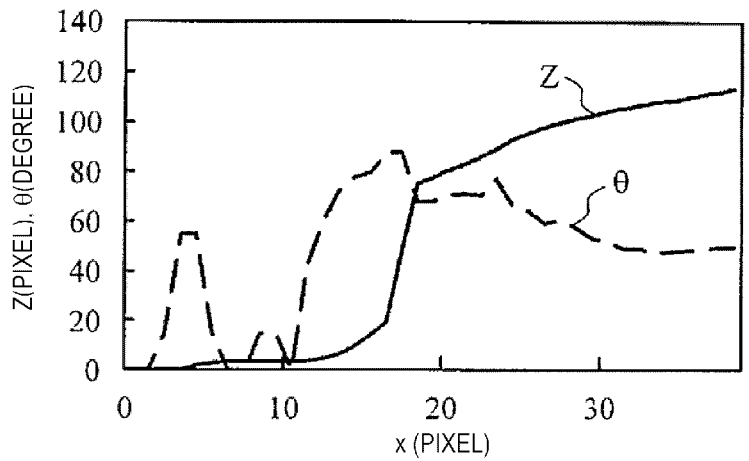
FIGS. 13A, 13B, and 13C are characteristic diagrams illustrating an estimation result of the cross-sectional shape for each sample illustrated in FIG. 4.
Figure 13B:
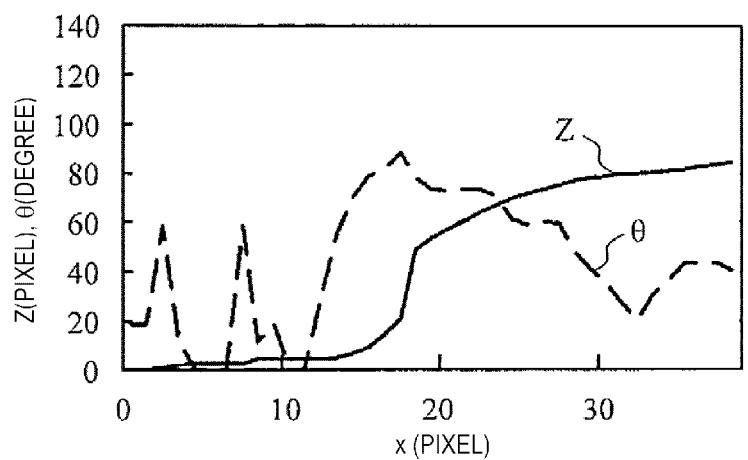
Figure 13C:
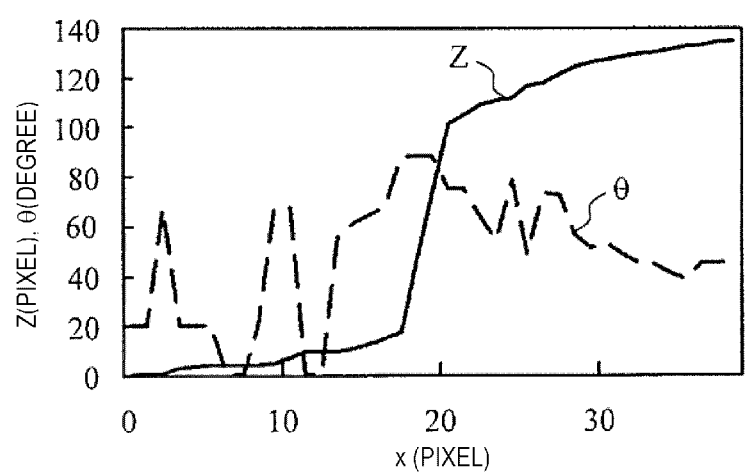

Here, using Equations 5 and 8, the distribution of θ(x) that is estimated from the σ_xz_near in FIG. 12 and the estimated cross-sectional shape Z(x) are respectively illustrated in an upper diagram (a), a middle diagram (b), and a lower diagram (c) of FIG. 13. It can be seen that the estimated cross-sectional shapes (the shapes indicated by a solid line) match the shapes (the shapes of the upper diagram (a), the middle diagram (b), and the lower diagram (c) of FIG. 4) obtained from separate cross-sectional observation.

Meanwhile, in the model-based shape estimation method, with respect to the various cross-sectional shapes, the distribution of the detection signal intensity therefor is obtained when changing the roughness of the surface (for example, the phase), and the variation (uncertainty) between the edge positions detected therefor is obtained in advance as a function of the threshold or the position in the x-direction. Next, variation (uncertainty) and the actual measurement result are matched, and the most similar cross-sectional shape is obtained, or the cross-sectional shape is estimated by interpolation or extrapolation.

Whereas there is a problem in that the measurement result is affected by the detection system or the detected intensity variation in the MBL method in the related art which estimates the cross-sectional shape by obtaining a matching relationship between the calculation result library of the intensity distribution itself of the detection signal and the measurement result, the present method is unlikely to be affected. However, both the present method and the MBL method in the related art can be used. Further, a maximum likelihood or the like may be used for matching.

(Structure Solid Shape Estimation Processing Procedure)

Figure 14:
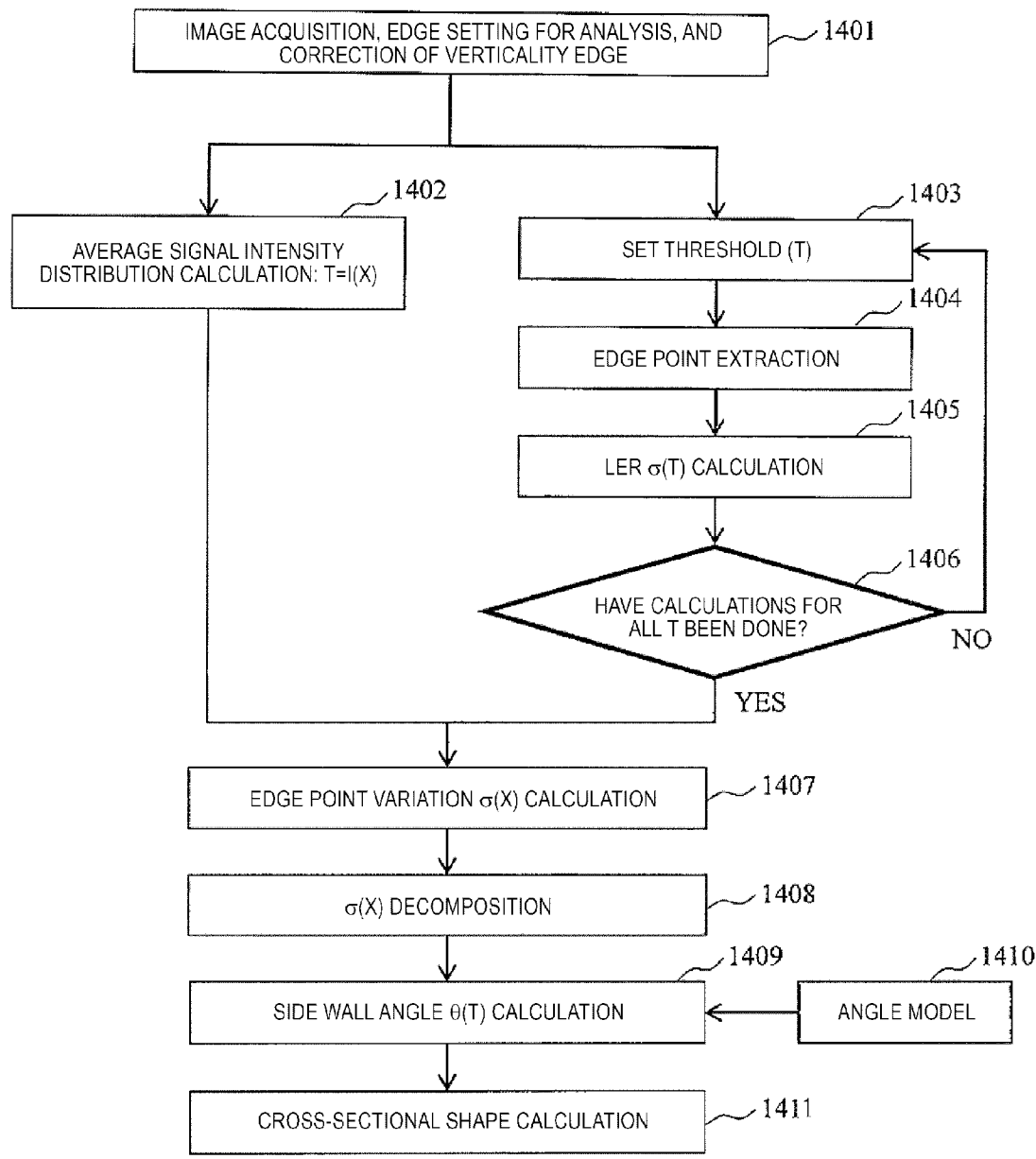
FIG. 14 is a flowchart explaining a processing procedure in the first embodiment.

FIG. 14 illustrates a flowchart of a method for estimating the solid shape of the structure, corresponding to the first embodiment. Further, the series of processes described below is implemented based on a program executed by a calculator.

First, a two-dimensional image is obtained by using an electron microscope, and an analysis region is specified (step 1401). Thereafter, the average signal intensity distribution I(x) of the specified analysis region is calculated (step 1402). The signal intensity is normalized by the maximum intensity in the specified range. In this case, it is desirable to adjust the image such that the average edge direction in the range is the y-direction.

Next, a threshold is set at every predetermined interval (for example, at every 5% in 5% to 100%) in a designated minimum value to a maximum value, a pattern edge is detected for each threshold, and LER which is a function of a threshold T is obtained (step S1403 to 1408). Here, the LER is converted into a function of x by using the relationship of T=I(x), and decomposed into respective components. Further, the sidewall angle θ is obtained according to Equation 5, Equation 6, Equation 7, Equation 8, and the like (steps S1409 and 1410), and the cross-sectional shape is obtained by integrating the sidewall angle θ in the x-direction (step S1411). In the description so far, the irregular pattern of the surface of the structure is assumed to be isotropic at the surface. With respect to roughness caused by the solubility variation in the local resist, the above assumption is almost correct. Meanwhile, the case where the assumption is not established will be described in Example 5 to be described later.

Example 1

In the present example, an example in which the above-described estimation method is applied to CD-SEM will be described.

(Apparatus Configuration)

Figure 15:
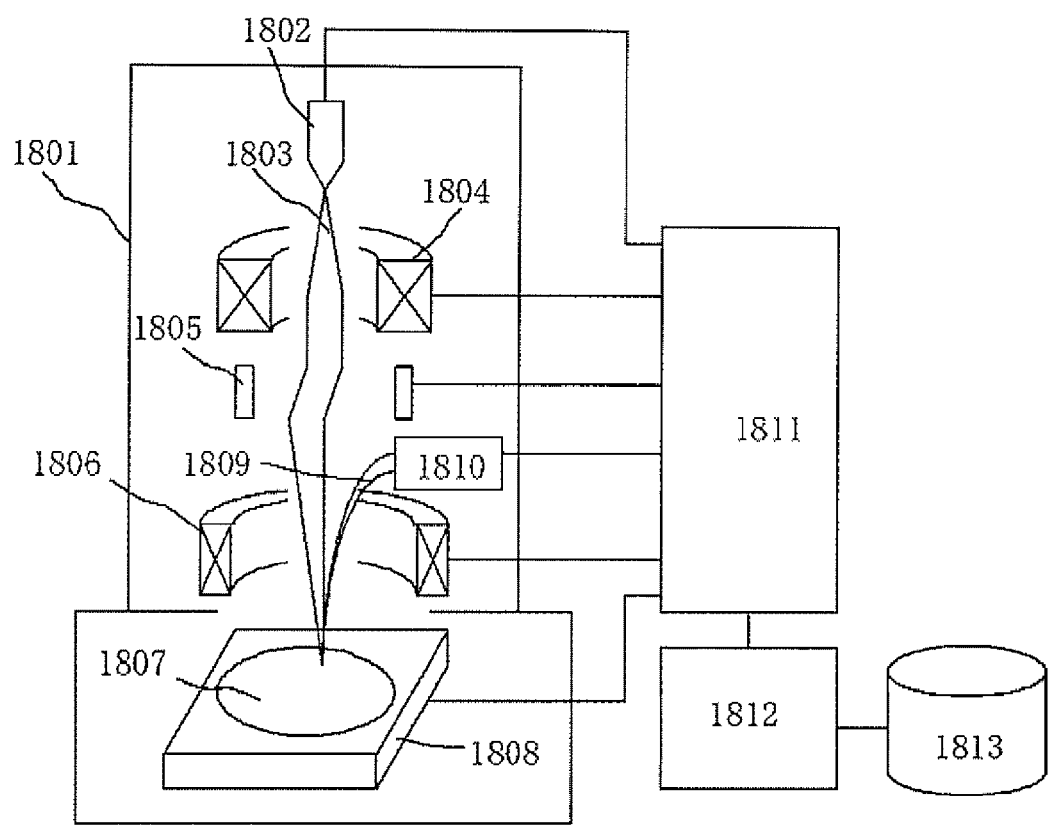
FIG. 15 is a schematic diagram illustrating a configuration example of an apparatus used in the first example.

FIG. 15 illustrates a schematic diagram of a hardware configuration of CD-SEM used in the present example. The CD-SEM in the present example is configured with a housing 1801 of a scanning type electron microscope mainly made of an electron optical column (SEM column) and a sample chamber, a control system 1811 of the scanning type electron microscope, and an information processing device 1812.

The information processing device 1812 is connected to a data storage device 1813 that stores the obtained scanning electron image, CAD data required for analysis, and the like. However, the data storage device 1813 may be included in the information processing device 1812. Although not illustrated, the information processing device 1812 includes an information input terminal by which the operator of the CD-SEM inputs information required for data processing to the device, and image display means for displaying the obtained scanning electron image. The specific example of the information input terminal includes a keyboard, a mouse, a GUI screen displayed on the image display means.

The electron optical column is configured with an electron gun 1802, a converging lens 1804, a deflector 1805, an objective lens 1806, a detector 1810, and the like. The sample chamber includes a stage 1808 for mounting an observation wafer 1807 thereon which is an object to be inspected. Secondary electrons 1809 generated by electron beams 1803, which are emitted from the electron gun 1802 to the observation wafer 1807, are detected by the detector 1810, converted into digital data by the control system 1811, and then transferred to the information processing device 1812, which generates image data to be used for analysis.

In the present example, the image data to be inspected is obtained by observing a pattern by using a scanning electron microscope included in the CD-SEM. The obtained image data is stored in the data storage device 1813; and after the observation is finished, the analysis of the roughness index and the cross-sectional structure estimation is performed by executing the image data analysis by operating the information input terminal. The analysis processing is executed by the information processing device 1812.

(Image Acquisition Process)

First, the control system 1811 (information processing device 1812) averages secondary electron signal intensities that are obtained by scanning the line pattern of the ArF resist 32 times from the upper left to the lower right of the field of view, and obtains a two-dimensional distribution image of the secondary electron signal intensity. If necessary, the information processing device 1812 displays the obtained image on the monitor screen of the CD-SEM. Here, the number of pixels of the observation image is 1500 pixels in the vertical and horizontal directions, one side of one pixel is 1 nanometer (nm), and the vertical and horizontal lengths of the observation image in the field of view are 1.5 μm (micrometer).

The information processing device 1812 sets an inspection area of a rectangular shape of 1024 vertical pixels and 50 horizontal pixels, in a region including an analyzed edge in the two-dimensional distribution image of the secondary electron signal intensity. Further, the minimum value Tmin, the maximum value Tmax, and the incremental value ΔT of the threshold T for edge extraction, and information required for data series extraction such as a sampling interval Δy in the y-direction, noise reduction parameters in the x-direction, and averaging parameters S in the y-direction for data extraction are set. In addition, it is possible to set the number of detection points rather than the sampling interval in the y-direction for data extraction. It is desirable that the inspection region and data series extraction conditions are set in advance through for example, the GUI screen of the CD-SEM.

Next, the information processing device 1812 performs a task of extracting the data series of edge roughness in the region. In other words, the information processing device 1812 calculates the signal intensity distribution corresponding to the y-coordinate at the sampling position from the pixel data in the inspection region, according to the set extraction start point and the sampling interval, and calculates the x-coordinate data of the edge point from the signal intensity distribution according to the threshold T which is set at every incremental value ΔT in a range of the minimum value Tmin to the maximum value Tmax. These processes are performed while moving in the y-direction according to the set sampling interval, and eventually, the data series of the edge roughness in the inspection region which is a function of the threshold T, X(T)={Δxi(T)}={Δx1(T), Δx2(T), . . . } is obtained.

Specifically, the information processing device 1812 sets the y-coordinate corresponding to the lower side of the inspection region as the y-coordinate of the data extraction starting point, sets 1 nanometer (nm) as the sampling interval in the y-direction, and extracts the positions (x1(T), y1(T)), . . . (xi(T), yi(T)), . . . and (x1024(T), y1024(T)) of 1024 points as the edge points at intervals of 1 nanometer (nm) in the inspection region.

Next, the information processing device 1812 obtains the values of fitting parameters α and β by approximating the extracted points to the following straight line.

$$x = \alpha y + \beta \qquad \text{[Equation 10]}$$

Next, the information processing device 1812 obtains deviations Δxi of the edge points from the straight line according to the following equation 11, with respect to the coordinates of the edge points for all thresholds T, and generates an edge roughness series X(T)={Δxi}T.

$$\Delta xi(T) = xi(T) - (\alpha yi(T) + \beta) \qquad \text{[Equation 11]}$$

(Image Processing Procedure)

Next, the information processing device 1812 obtains LER for each threshold, from the edge roughness series X(T)={Δxi(T)}, and decomposes the measured LER into a measured variation σ_y based on a true LER, and a measured variation σ_xz based on a surface roughness. It is possible to use, for example, the method disclosed in PTL 1 for a method for obtaining the measured variation σ_y based on a true LER and the measured variation σ_xz based on a surface roughness from the edge roughness series, but its representative means are as follows.

As described above, a component (true LER) of which the power spectral density is inversely proportional to the square of the spatial frequency f and the other high frequency components (noise) are superimposed on the measured LER. If the measured LER is subjected to an averaging process, the latter component is reduced. Therefore, with an increase in a parameter value representing the degree of the averaging process, the power spectral density distribution in a high frequency region is inversely proportional to the square of f. Specifically, if considering that respective one-dimensional signal intensities distribution in the x-direction of S different y-coordinates are averaged in the y-direction, the intensity of a random noise is reduced to 1/S by the averaging. In other words, with an increase in averaging parameter S, the frequency dependence of the power spectral density approaches $1/f^2$. The density of the power spectrum obtained at this time is the true LER.

Here, the S dependence is fitted into the following equation, with the value of the line edge roughness index obtained from the data subjected to the averaging process with the averaging parameter S as σm(S).

$$\sigma_m(S) = \sqrt{\sigma_0^2 + \frac{\{\sigma_e(1)\}^2}{S} - 2A\Delta y(S-1)} \qquad \text{[Equation 12]}$$

Here, σm(1) is a line edge roughness measurement value obtained from the data before the averaging process, Δy is a y-direction extraction interval of the edge point, and A is a fitting parameter. It is preferable that S and the extraction interval Δy of the edge point satisfy 2SΔy<1/f₀ [nanometer (nm)]. Here, when $f_0$ is a normal resist pattern, it is likely to be $0.008 \text{ nm}^{-1}$ or less at a bent point of a spectrum.

Here, $\sigma_0 = \sigma$ which is obtained for the smallest S among S explaining the experimental result in detail is set to the true LER. In this case, the measurement variation component at that does not depend on the spatial frequency is obtained by the following equation.

$$\sigma b(T) = (\sigma m(T)^2 - \sigma_0^2)^{0.5} \qquad \text{[Equation 13]}$$

Further, the information processing device 1812 obtains the measurement error σ_noise from the measured LER, and removes the σ_noise from σb(T) so as to obtain σ_xz(T) representing the measurement variation (uncertainty) caused by the irregular pattern of the sidewall surface being projected on the xy plane.

$$\sigma\_xz(T) = (\sigma b(T)^2 - \sigma\_noise^2)^{0.5} \qquad \text{[Equation 14]}$$

Here, the sidewall angle θ in the height corresponding to the threshold T of the structure is obtained by the following equation.

$$\cos(\theta(T)) = \sigma x(T)/\sigma s \qquad \text{[Equation 15]}$$

Here, σs is a representative value of the spatial period of the surface roughness.

Meanwhile, the average <I>(x) of the signal intensity distribution in the x-direction is calculated with respect to the measurement range in the y-direction. The edge coordinate x corresponding to the threshold T can be obtained from $x = <I>^{-1}(T)$. Here, $<I>^{-1}$ is the reverse function of <I>.

However, the cross-sectional shape z(=Z(x)) of the structure can be obtained by the following equation, as described above.

$$z = \int dz = \int dx \cdot \tan\theta(x) = \int dx/dT \cdot \tan\theta(T) dT \qquad \text{[Equation 16]}$$

Here, the integration range is T=Ia(0) to T=Ia(x).

The cross-sectional shape obtained in this manner is compared with the cross-sectional shape obtained by cutting the pattern portion of the wafer and observing it with SEM, and it is confirmed that both match to each other. Further, although it is compared with the measurement result by AFM, it is also confirmed that both match to each other.

In addition, the σs and the σ_noise are values having physical meaning and are independently measured and obtained, in the above description, but these amounts may be regarded as fitting parameters. In other words, the σs and the σ_noise may be used in such a manner that the cross-sectional shape which is observed by other methods and the cross-sectional shape which is estimated by the present invention match well.

Example 2

In this example, an example of a method capable of estimating the solid structure for a two-dimensional mask pattern as well as the cross-sectional structure of a one-dimensional mask pattern will be described. Since the configuration of the scanning electron microscope used in this example is the same as in Example 1, the description thereof will be omitted.

The following two methods are considered as methods for expanding the method of Example 1 to the two-dimensional mask pattern.

[First Method]

In this method, a relationship between the threshold and the pattern height for the one-dimensional pattern is obtained by the method of Example 1, and the relationship is applied to the two-dimensional pattern, as it is.

[Second Method]

In this method, the method of Example 1 is extended to two-dimensional edge information.

First, the first method will be described. The information processing device 1812 obtains (estimates) the cross-sectional shape $z=Z(x)$ by applying the method of Example 1 to the one-dimensional pattern portion, with respect to the two-dimensional image (the upper left diagram of FIG. 16) obtained similar to the method of Example 1.

Next, the information processing device 1812 obtains the relationship $z=Z'(T)$ between the height z and the threshold T of the structure, by deleting x from the relationship between $z=Z(x)$ and the signal intensity distribution $T=I(x)$ used in the derivation of the above shape. If edges are extracted by changing the threshold T with respect to the SEM observation image for the two-dimensional mask pattern in the upper-left diagram of FIG. 16, the contour line as the upper middle diagram of FIG. 16 is obtained.

Figure 16:
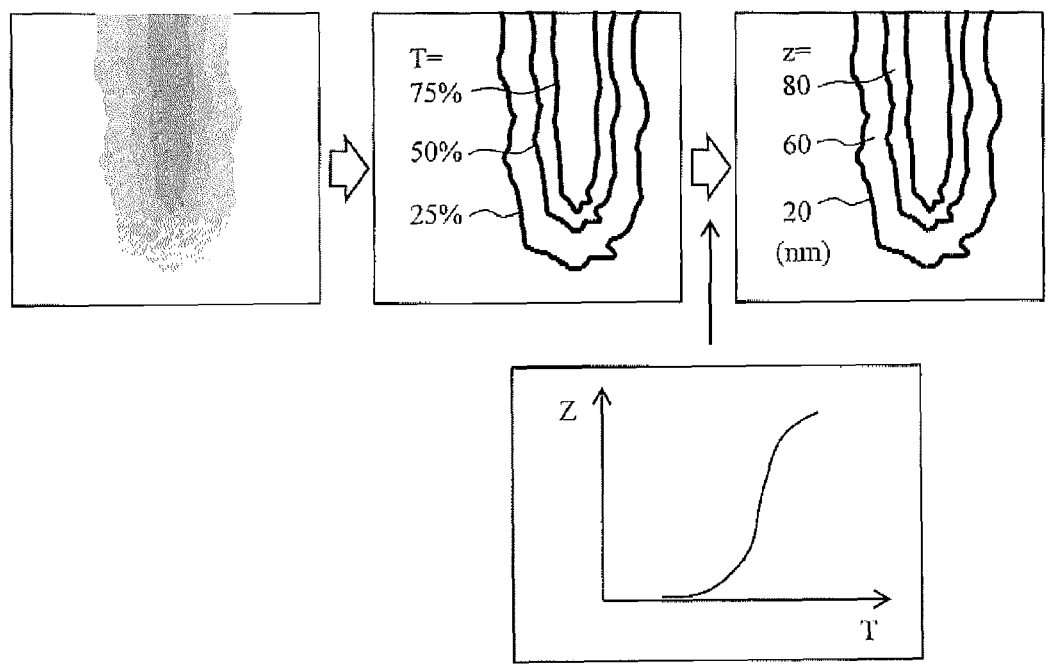
FIG. 16 is a schematic diagram of a three-dimensional shape estimation method according to a second example.

Next, the information processing device 1812 coverts T into z, in the upper left diagram of FIG. 16, according to the relationship between the height z and the threshold T of the structure, and obtains the height information on the two-dimensional pattern as the upper right diagram of FIG. 16. In addition, the relationship illustrated in the lower part of FIG. 16 is established between T and z. Data giving the relationship is stored in advance in, for example, the data storage device 1813.

The problems of this method is that this method necessarily does not ensure that the relationship $z=Z(T)$ between the height z and the threshold T of the structure which is obtained by the method of Example 1 is established in the structure of the two-dimensional mask pattern. In general, the relationship between the height and the signal intensity is not unique. However, with respect to patterns of which pattern characteristics such as a line width are similar, this method can provide a relatively good approximation.

Next, the second method will be described. This method can be applied when the same design pattern exists at a plurality of different positions on the same mask. First, the information processing device 1812 obtains a plurality of SEM images (signal intensity distribution) by observing a plurality of two-dimensional patterns on the wafer, which are formed for a plurality of the same two-dimensional pattern on the mask with SEM under the same condition.

With respect to the plurality of SEM images, the information processing device 1812 obtains an edge coordinate sequence taken at a certain threshold T, and considers a contour line connecting respective coordinate points. In this case, in order to ensure measurement accuracy, it is desirable to obtain the signal intensity distribution along a direction substantially perpendicular to the contour line and apply a threshold thereto, for the extraction of edges.

Next, the information processing device 1812 shifts each image in a parallel direction such that the sum of the distance deviations between contour lines obtained for the plurality of images is minimized. The reference of the shift position may appropriately be set. Further, the information processing device 1812 obtains an average shape for the contour lines of respective images subjected to the parallel shift, and calculates a difference (distance) between the average shape and an average shape in a direction vertical to the tangent of the contour line for the contour line of each image.

The information processing device 1812 obtains a standard deviation of the distribution of a difference, for each edge point, and assumes the obtained standard deviation as a value corresponding to σb(T) in Example 1. Thus, similar to Example 1, the inclination angle θ obtained by using Equation 5, Equation 6, Equation 7, Equation 8, and the like is set to a sidewall angle θ of the height corresponding to the threshold T at the corresponding position. The integration is performed in the same manner as Equation 9 along the direction in which the edge is extracted by changing the threshold T, and thus it is possible to obtain a vertical structure in the direction.

Although there is a concern that the σb(T) obtained by the second method contains a component corresponding to the true LER, the edge shift due to LER of a relatively long period is expected to be cancelled by performing a parallel shift. Further, it is desirable to appropriately remove a component of a short period and a measurement miscalculation component of the true LER from the σb(T).

Even in this example, similar to the case of Example 1, the σs and the σe are values having physical meaning and may be independently measured and obtained, and may be regarded as fitting parameters. The inventors confirmed that the cross-sectional shape of the structure which is estimated by such a method matches well the cross-sectional shape which is observed as an SEM image by cutting the same structure.

Example 3

In this example, a description will be made regarding a case of applying the present invention to a resist pattern forming process by photolithography used in manufacturing of a semiconductor integrated circuit or the like, quality evaluation of a solid structure of a semiconductor integrated circuit formed by using the process, and a process monitor.

Figure 17A:
FIGS. 17A, 17B, and 17C are schematic diagrams of a process monitor according to a third example.
Figure 17B:
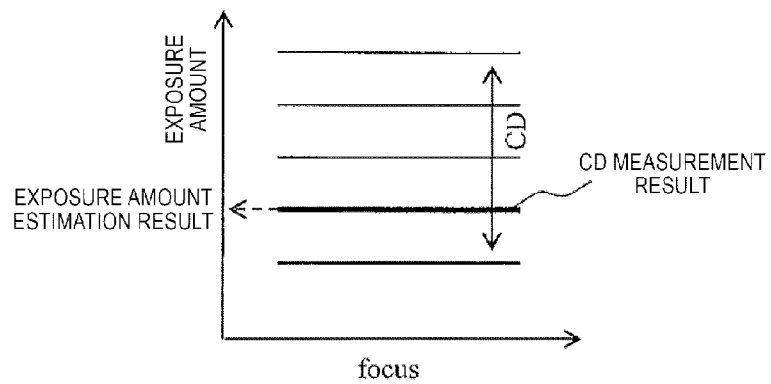
Figure 17C:
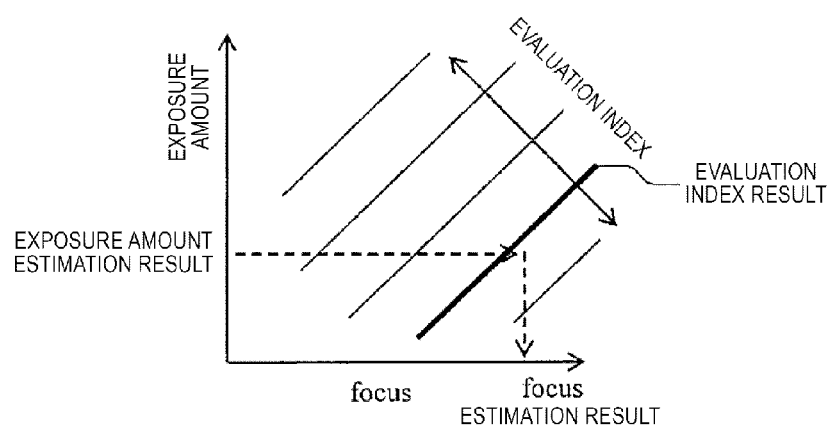

In this example, as the quality indicator of the formed pattern, a value obtained by integrating the absolute value of the deviation between the height of the estimated pattern and the height of the designed pattern, for the entire evaluation region, or the root mean square of the value are used (the amount corresponding to the area of a portion indicated by hatching in the right diagram of the upper diagram (a) of FIG. 17).

In addition, more simply, the ratio Sp/Si of the cross-sectional area Sp of the cross-sectional shape (for example, the lower part of a curve in the left diagram of the upper diagram (a) of FIG. 17) that is estimated by applying the method of the Example described above relative to the cross-sectional area Si of an ideal design shape (for example, a rectangular portion in the left diagram of the upper diagram (a) of FIG. 17) (in the case of an one-dimensional mask pattern), or the ratio Vp/Vi of the volume Vp of the shape that is estimated by the method of the Examples described above relative to the volume Vi of an ideal design shape (in the case of a two-dimensional mask pattern) may be used as a pattern quality index. However, in this case, it is preferable to treat the area or the volume of a pattern present at a region where the designed pattern should not exist originally, as a negative value. Thus, even when the pattern exists at a region where the designed pattern should not exist originally, it is possible to detect the existence as quality degradation.

For the ideal design shape for the two-dimensional mask pattern, it is possible to use a design shape of a circuit pattern, an optical simulation result of a mask pattern obtained by applying an optical proximity effect correction on the circuit design shape, a maximum value among volumes estimated by applying the method described in the above examples to the various actual exposure results, or the like.

With respect to the wafer exposed by variously changing the focus and exposure amount conditions in a matrix shape for each exposure shot on the wafer in a pattern forming exposure apparatus, the resist pattern for the same pattern on the mask for each of the exposure shot is observed with a CD-SEM, the pattern size is measured for each shot from the observation image, the cross-sectional shape of the pattern is estimated by the method described in Example 1, and the pattern quality indicators are obtained.

As illustrated in the middle diagram (b) of FIG. 17, the dimension of the pattern monotonously decreases relative to the exposure amount, a pattern dimensional change for the focus setting value is small, and it is difficult to estimate the focus setting value from the pattern dimensional change. In contrast, as illustrated in the lower diagram (c) of FIG. 17, the pattern quality index almost monotonously varies relative to both setting values of the exposure amount and focus, and is applied as a monitor of a focus setting value. However, the pattern quality index varies relative to the exposure amount. Thus, it is desirable to first estimate the exposure amount from the pattern dimensional change, and estimate the focus setting value by using the pattern quality index for the exposure amount.

As in this example, if the estimated cross-sectional shape is used for the quality index of the formed pattern, it is possible to determine an optimal production condition simply and at a high speed, or detect the quality deterioration. Further, if the determination result and the like are fed back to the manufacturing process, it is possible to suppress the quality deterioration of a pattern to be formed, and improve the performances of the various elements including a semiconductor device.

Example 4

In this example, a method of frequency analysis of the two-dimensional signal intensity distribution in the x and y-directions will be described as another method of obtaining $\sigma x$ and $\sigma s$. In other words, a method of estimating a two-dimensional solid shape of a three-dimensional shape according to the second embodiment will be described.

Figure 18A:
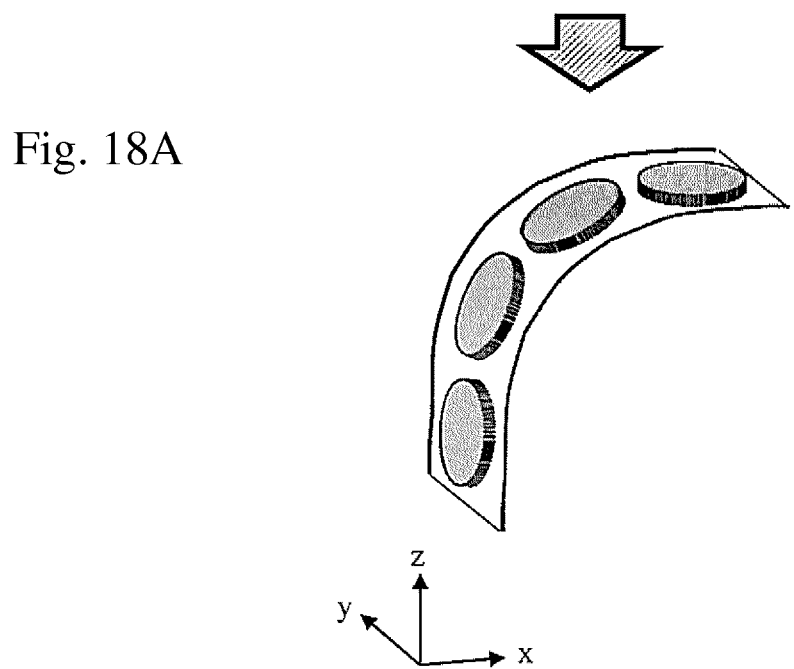
FIGS. 18A and 18B are additional conceptual diagrams illustrating a characteristic example of an observed structure.
Figure 18B:
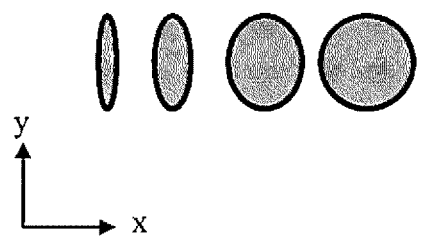

Here, it is assumed that isotropic surface roughness is present along the surface on the entire surface of the sidewall of the solid structure such as in the upper diagram (a) of FIG. 18 and only the roughness information is observed from the above of the solid structure. In this case, the pattern illustrated in the lower diagram (b) of FIG. 18 is considered to be acquired as roughness information.

Here, if the x-direction period of the roughness is Lx and the y-direction period is Ly, the inclination angle $\theta$ is obtained from the following equation.

$$\cos(\theta) = Lx/Ly \qquad \text{[Equation 17]}$$

Figure 19:
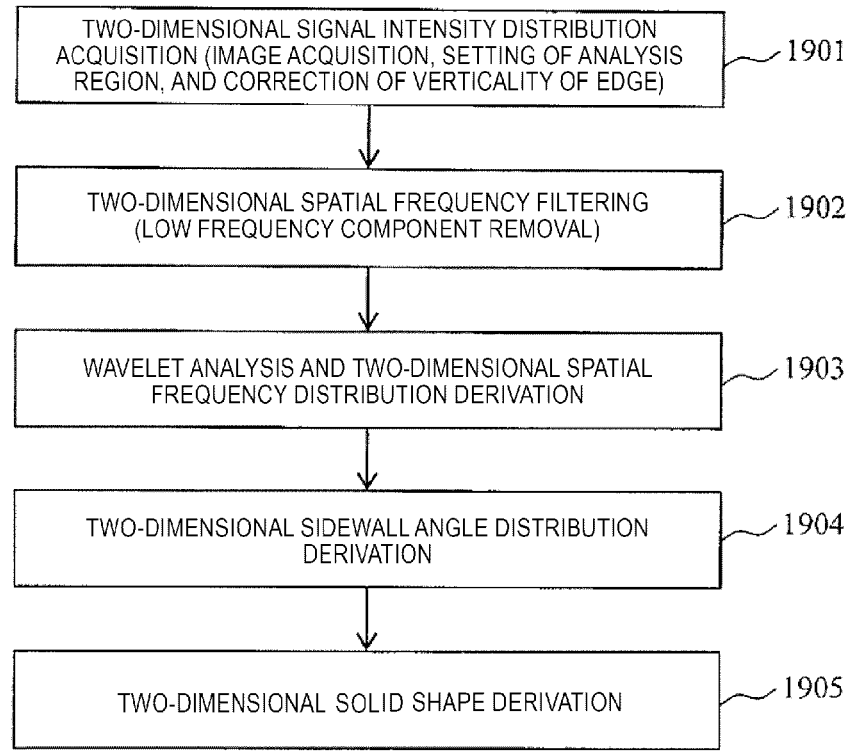
FIG. 19 is a flowchart explaining a processing procedure in the second embodiment.

In this case, the two-dimensional intensity distribution of the observed secondary electron signal includes three variation factors with first, macro intensity distribution in the x-direction, second, an intensity variation due to the true LER in the y-direction, and third, local intensity variation due to surface roughness. Accordingly, it is possible to extract only the third surface roughness information by removing the first and second variation factors from the observation image. One example of a specific procedure will be described with reference to FIG. 19.

First, the information processing device 1812 specifies the analysis region after obtaining the SEM image, and obtains the two-dimensional intensity distribution in the region (step S1901). Next, in the information processing device 1812, the obtained two-dimensional intensity distribution is subjected to a two-dimensional spatial frequency filtering, and decomposed into the sum of the portion due to the first variation component and the portion except for the high frequency component of the second variation component and the sum of the high frequency component of the second variation component and the portion due to the third variation factor (step S1902). The latter includes a high frequency component of a variation due to true LER and a variation due to the surface roughness.

In general, since the sidewall angle $\theta$ of the structure varies in the x-direction, the x-direction spatial period of the intensity distribution variation varies in the x-direction. Therefore, it is desirable to locally evaluate the spatial period in the x-direction. A general method of performing such an analysis includes, for example, wavelet analysis. The information processing device 1812 performs the wavelet analysis in the x-direction, and detects a variation in the spatial frequency characteristics in the x-direction (step S1903).

Figure 20:
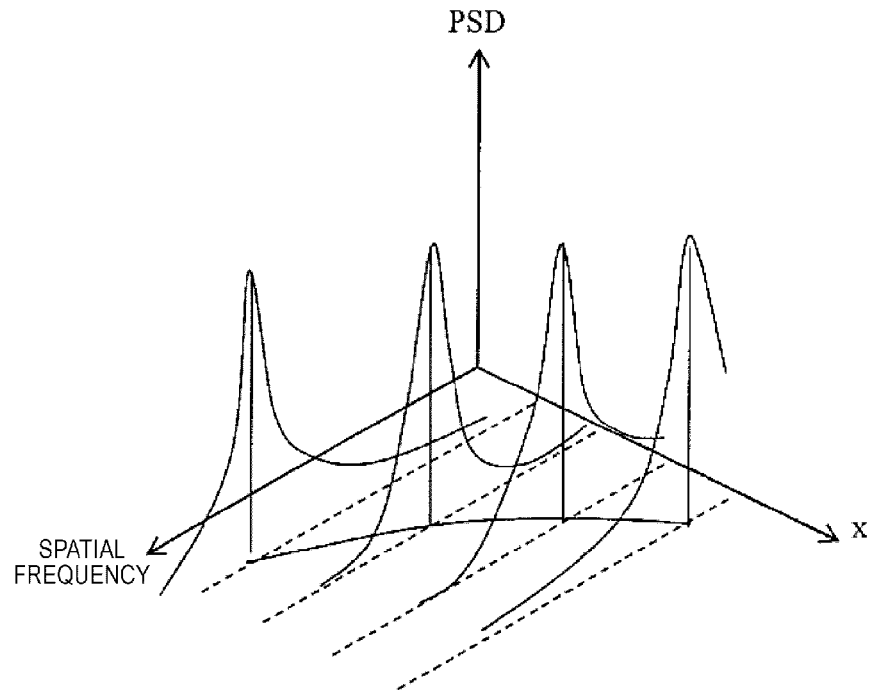
FIG. 20 is a characteristic diagram explaining an analysis result according to the second embodiment.

An example of x-dependence of the spatial frequency characteristics (the spatial frequency dependence of the power spectral density PSD) obtained by the method is illustrated in FIG. 20. The spatial frequency characteristics vary depending on x; when there is a peak in the characteristics, the frequency at the peak position is set to a representative spatial frequency; when a peak is not clear, the spread distribution of the spatial frequency (for example, a half width) is set to a representative spatial frequency, and the spatial period $\sigma x$ in the x-direction is obtained by the reciprocal. Similarly, the information processing device 1812 obtains $\sigma y$ from the representative spatial frequency obtained by performing the spatial frequency analysis in the y-direction. In addition, the information processing device 1812 may perform the two-dimensional wavelet analysis in both x and y directions. In addition, in this process, if necessary, the information processing device 1812 estimates the high frequency component of the second variation component, and removes the high frequency component from the latter. Thus, the information processing device 1812 obtains the two-dimensional distribution of $\sigma x$ and $\sigma y$.

The information processing device 1812 obtains the two-dimensional distribution θ(x, y) of the sidewall angle by the following equation (step S1904).

$$\cos(\theta(x,y)) = \sigma x(x,y)/\sigma y(x,y) \quad \text{[Equation 18]}$$

Further, the information processing device 1812 estimates a two-dimensional solid shape by integrating the above equation at the position (x, y) (step S1905).

Example 5

Figure 21:
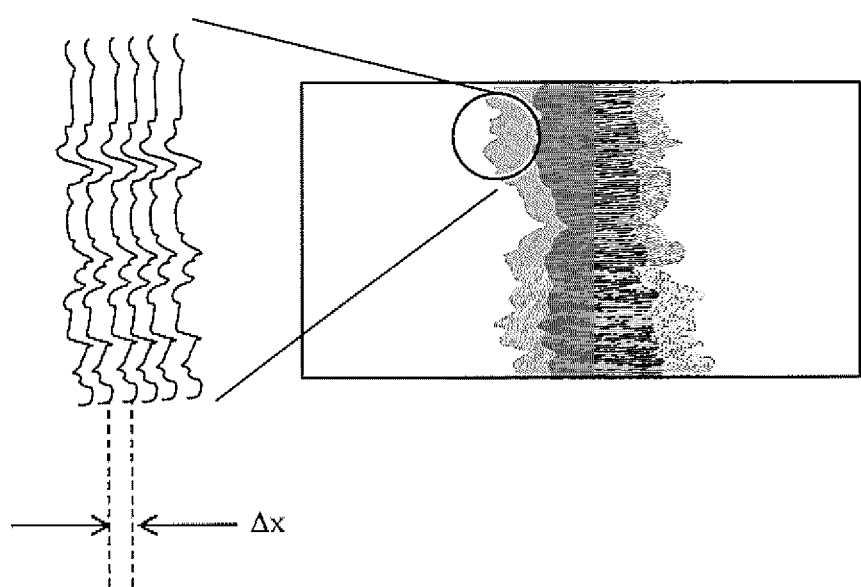
FIG. 21 is a conceptual diagram explaining a fifth example.

In this example, a description will be made regarding the case where the irregular pattern formed on the surface of the structure is not necessarily isotropic. In the case where the assumption of the irregular pattern of the structure surface being isotropic is not established, for example, the sidewall shape of the resist structure is influenced sometimes by the standing wave due to interference of the exposure light in the resist film. In this case, as illustrated in FIG. 21, the intensity distribution of the secondary electron signal for one edge of the structure is observed as a plurality of parallel edges. In this case, the sidewall inclination angle between a plurality of edges is expressed by the following equation, with the edge interval as ΔLx.

$$\tan \theta = \Delta L/(\lambda/2n) \quad \text{[Equation 19]}$$

However, λ is the wavelength of the light used for exposure of the resist pattern, and n is the refractive index of the resist material for the light of the wavelength. A standing wave appears when the reflection from the resist under-layer film is large during resist exposure, but in this case, the resist size varies more sensitively to the variation in the resist film thickness. Since this is not desirable in an actual production process, a sufficient reflection prevention measure is made normally to suppress it. Therefore, in practice, such a standing wave rarely gives impact.

As another case where the assumption of the surface roughness being isotropic is not established, a resist pattern having an isotropic surface roughness is etched and a structure to be etched is transferred in some cases. The roughness of the resist pattern surface is transferred to the structure surface of a film to be etched, through etching, but according to the roughness analysis of the structure after etching transfer, the roughness of the structure to be etched is almost affected by the roughness of the resist structure.

Figure 22:
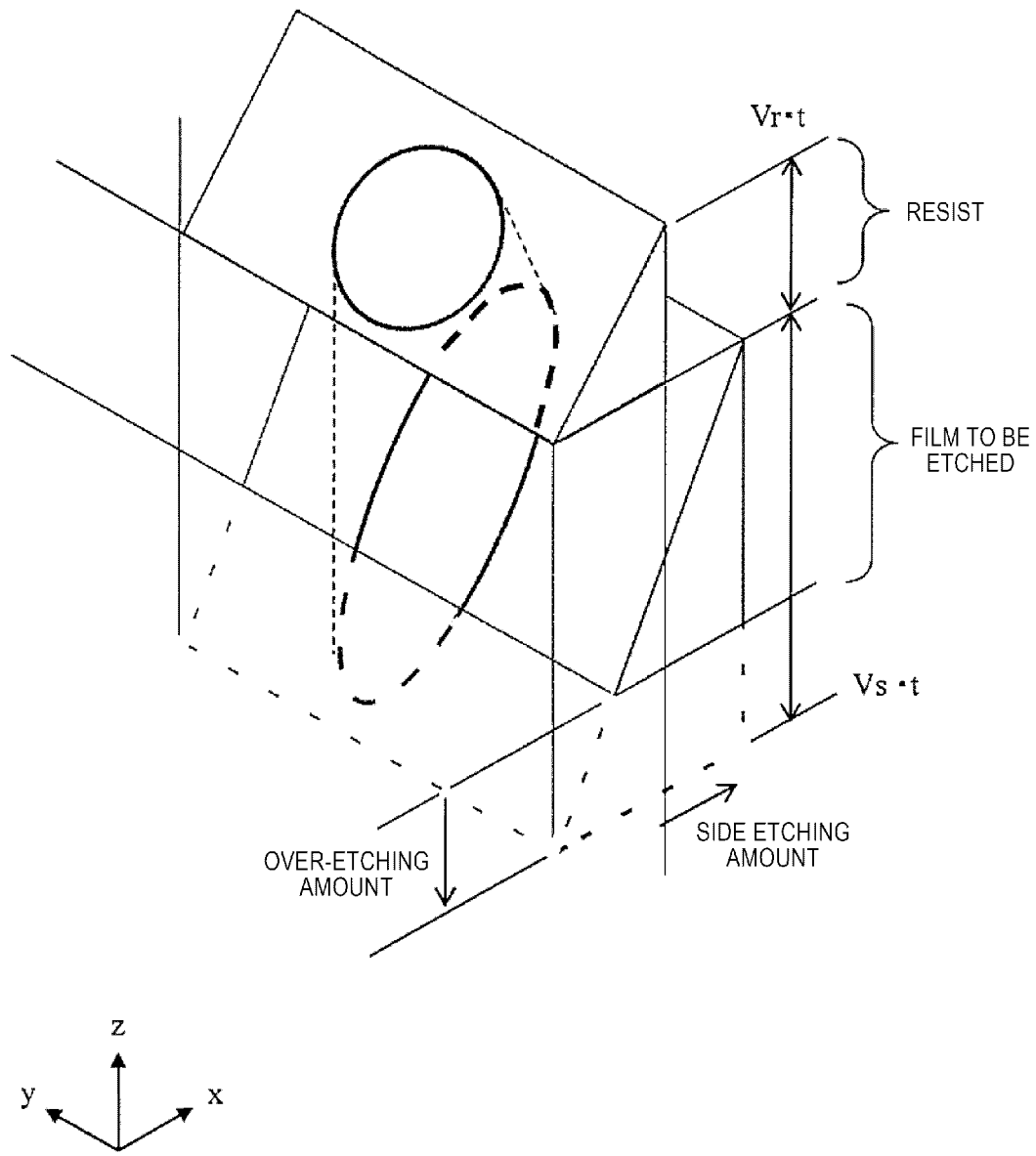
FIG. 22 is a conceptual diagram explaining the fifth example.

In this case, as illustrated in FIG. 22, the period in the edge direction (y-direction) of the roughness does not change, and the longitudinal dimension changes. Here, assuming the etching is completely anisotropic, with the ratio between the etching speed Vr of resist material and the etching speed Ve of the etching film to be etched as Retch=Ve/Vr, the longitudinal dimension of the roughness is considered to be approximately Retch times. In this case, assuming that the sidewall angle is relatively steep, L in Equation 5 also may be Retch times.

In practice, the etching progresses also in the direction (x-direction) perpendicular to the edge direction (etching). In this case, the length and width ratio of the roughness is not necessarily equal to Retch. Thus, for example, it is preferable to optimize L in Equation 5 as a fitting parameter such that the cross-sectional shape observed by other methods and the cross-sectional shape estimated by the method described above match well.

Further, the most general concept of the present invention is to estimate the solid shape of a structure, from the information on the local variation of the signal intensity distribution of the two-dimensional image obtained by observing the structure from the above. Therefore, an estimation algorithm is not limited to the method described above.

Other Examples

In addition, the present invention is not limited to the examples described above, and includes various modification examples. For example, some examples are described in detail in order to facilitate the description of the present invention, and the above-described examples do not need to necessarily include all of the configurations described above. Further, it is possible to replace a portion of one example with the configuration of another example, and combine the configuration of one example with the configuration of another example. Further, it is possible to add, delete, or replace other configurations, with respect to a portion of the configuration of each example.

Further, some or all of respective components, functions, processing units, processing means, and the like may be implemented as, for example, an integrated circuit or other hardware. Further, the respective components, the functions, and the like may be implemented by a processor interpreting and executing each program that implements each function. In other words, they may be implemented as software. Information such as a program that implements each function, a table, and a file can be stored in a storage device such as a memory, a hard disk, and a solid state drive (SSD), or a storage medium such as an IC card, an SD card, and a DVD.

Further, control lines and information lines which are considered to be necessary for explanation are illustrated, and all of the control lines and the information lines necessary in a product are not illustrated. In fact, almost all components may be considered to be connected to each other.

REFERENCE SIGNS LIST

1801 HOUSING OF SCANNING ELECTRON MICROSCOPE
1802 ELECTRON GUN
1803 ELECTRON BEAM
1804 CONVERGING LENS
1805 DEFLECTOR
1806 OBJECTIVE LENS
1807 WAFER TO BE OBSERVED
1808 STAGE
1809 SECONDARY ELECTRON
1810 DETECTOR
1811 CONTROL SYSTEM
1812 INFORMATION PROCESSING DEVICE
1813 DATA STORAGE DEVICE

The invention claimed is:

1. A pattern shape evaluation method causing a computer to perform:
  a process of obtaining an observation image of an upper surface of a solid structure, by causing the upper surface of a substrate to be irradiated and scanned with a converged energy beam from a direction substantially perpendicular to a main surface of the substrate having the three-dimensional structure formed on the upper surface thereof, and detecting or measuring intensities of a secondary energy beam generated in the substrate and the structure or an energy beam reflected or scattered from the substrate or the structure;

a process of obtaining uncertainty information regarding an intensity of scattering caused by an irregular shape of a surface of the structure, from an irradiation position of the converged energy beam in the observation image of the upper surface and the measured intensity;

a process of obtaining an inclination angle θ of the surface of the structure, based on the obtained uncertainty information; and a process of estimating a solid shape of the structure, based on the obtained inclination angle θ.

2. The pattern shape evaluation method according to claim 1, wherein the converged energy beam is a convergence electron beam, and the secondary energy beam is a secondary electron.

3. The pattern shape evaluation method according to claim 1, wherein the process of obtaining uncertainty information includes a sub-process of calculating a variation value of an edge point, by extracting a plurality of edge point sequences corresponding to a plurality of different levels of the intensity of the secondary energy beam, and calculating a deviation of a coordinate of each of the plurality of edge point sequences from a designed coordinate; and a sub-process of obtaining an inclination angle of the surface of the structure at each position on the observation image of the upper surface corresponding to each of the plurality of different levels, based on the variation value.

4. The pattern shape evaluation method according to claim 3, wherein the sub-process of calculating the variation value of the edge point includes a process of obtaining a component that does not depend on spatial frequency of each of the plurality of edge point sequences; and a process of removing a component of which a power spectrum is inversely proportional to the square of the spatial frequency, from the edge point sequences; or a process of removing a detected noise component.

5. The pattern shape evaluation method according to claim 1, wherein the process of obtaining the inclination angle θ obtains in a predetermined region where there is the observation image of the upper surface, an inclination angle θ of the region, relative to the main surface of the substrate, as a function of the uncertainty information σx.

6. The pattern shape evaluation method according to claim 1, wherein the process of obtaining the inclination angle θ sets a plurality of different thresholds with respect to distribution of the intensity of the observation image of the upper surface, and regards the inclination angle θ obtained by extracting each of a plurality of edge point sequences for each threshold, as the inclination angle θ at the edge position of each of the plurality of edge point sequences, and wherein the process of estimating the three-dimensional shape obtains an inclination angle distribution at each point of the observation image of the upper surface and integrates inclination angle distributions so as to estimate the solid shape.

7. The pattern shape evaluation method according to claim 1, wherein the process of obtaining the uncertainty information includes a sub-process of obtaining an inclination angle of the surface of the structure in a local region in the observation image of the upper surface, based on a difference between spatial frequency characteristics in directions perpendicular and parallel to the edge of the intensity variation of the secondary energy beam in the local region.

8. The pattern shape evaluation method according to claim 3, wherein the edge point sequence is curved.

9. A semiconductor device manufacturing method causing a computer to perform:

a process of obtaining an observation image of an upper surface of a solid structure, by causing the upper surface of a substrate to be irradiated and scanned with a converged energy beam from a direction substantially perpendicular to a main surface of the substrate having the solid structure including a semiconductor device formed on the upper surface thereof, and detecting or measuring intensities of a secondary energy beam generated in the substrate and the structure or an energy beam reflected or scattered from the substrate or the structure;

a process of obtaining uncertainty information regarding an intensity of scattering caused by an irregular shape of a surface of the structure, from an irradiation position of the converged energy beam in the observation image of the upper surface and the measured intensity;

a process of obtaining an inclination angle θ of the surface of the structure, based on the obtained uncertainty information;

a process of estimating a solid shape of the structure, based on the obtained inclination angle θ; and a process of estimating manufacturing conditions in a manufacturing process of the semiconductor device, based on characteristics of the estimated solid shape.

10. A pattern shape evaluation device comprising:

a data processing unit that obtains an observation image of an upper surface of a solid structure, by causing the upper surface of a substrate to be irradiated and scanned with a converged energy beam from a direction substantially perpendicular to a main surface of the substrate having the three-dimensional structure formed on the upper surface thereof, and detecting or measuring intensities of a secondary energy beam generated in the substrate and the structure or an energy beam reflected or scattered from the substrate or the structure;

a data processing unit that obtains uncertainty information regarding an intensity of scattering caused by an irregular shape of a surface of the structure, from an irradiation position of the converged energy beam in the observation image of the upper surface and the measured intensity;

a data processing unit that obtains an inclination angle θ of the surface of the structure, based on the obtained uncertainty information; and a data processing unit that estimates a solid shape of the structure, based on the obtained inclination angle θ.

* * * * *